(12) United States Patent
Lee et al.

(10) Patent No.: US 12,205,939 B2
(45) Date of Patent: Jan. 21, 2025

(54) SEMICONDUCTOR PACKAGE

(71) Applicant: Samsung Electronics Co., Ltd., Suwon-si (KR)

(72) Inventors: Doohwan Lee, Asan-si (KR); Seokhyun Lee, Hwaseong-si (KR); Jeongho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 640 days.

(21) Appl. No.: 17/501,108

(22) Filed: Oct. 14, 2021

(65) Prior Publication Data

US 2022/0310577 A1  Sep. 29, 2022

(30) Foreign Application Priority Data

Mar. 26, 2021  (KR) .................. 10-2021-0039589

(51) Int. Cl.
*H01L 25/18* (2023.01)
*H01L 23/498* (2006.01)
*H01L 23/538* (2006.01)
*H01L 25/065* (2023.01)

(52) U.S. Cl.
CPC ........ *H01L 25/18* (2013.01); *H01L 23/49811* (2013.01); *H01L 23/5381* (2013.01); *H01L 23/5383* (2013.01); *H01L 23/5385* (2013.01); *H01L 23/5386* (2013.01); *H01L 25/0652* (2013.01); *H01L 2225/06513* (2013.01); *H01L 2225/06517* (2013.01)

(58) Field of Classification Search
CPC ............... H01L 25/18; H01L 23/49811; H01L 23/5381; H01L 23/5383; H01L 23/5385; H01L 23/5386; H01L 25/0652; H01L 2225/06513; H01L 2225/06517
See application file for complete search history.

(56) References Cited

U.S. PATENT DOCUMENTS

| 8,698,317 B2 | 4/2014 | Seo et al. |
| 9,368,450 B1 | 6/2016 | Gu et al. |
| 10,515,829 B2 | 12/2019 | Wu et al. |

(Continued)

FOREIGN PATENT DOCUMENTS

KR  101966328 B1  4/2019

*Primary Examiner* — Fernando L Toledo
*Assistant Examiner* — Neil R Prasad
(74) *Attorney, Agent, or Firm* — Muir Patent Law, PLLC

(57) ABSTRACT

A semiconductor package may include a first redistribution layer, a passive device disposed on a top surface of the first redistribution layer, a bridge structure disposed on the top surface of the first redistribution layer and laterally spaced apart from the passive device, a second redistribution layer disposed on and electrically connected to the passive device and the bridge structure, conductive structures disposed between the first redistribution layer and the second redistribution layer and laterally spaced apart from the passive device and the bridge structure, a first semiconductor chip mounted on a top surface of the second redistribution layer, and a second semiconductor chip mounted on the top surface of the second redistribution layer. The conductive structures may include a signal structure and a ground/power structure, which is laterally spaced apart from the signal structure and has a width larger than the signal structure.

18 Claims, 21 Drawing Sheets

(56) References Cited

U.S. PATENT DOCUMENTS

| | | |
|---|---|---|
| 10,797,000 B2 | 10/2020 | Deshpande et al. |
| 2019/0304913 A1 | 10/2019 | Wu et al. |
| 2020/0006232 A1 | 1/2020 | Pietambaram et al. |
| 2020/0058627 A1 | 2/2020 | Chen et al. |
| 2020/0273799 A1* | 8/2020 | Sung ........................ H01L 24/17 |
| 2021/0183794 A1* | 6/2021 | Tang ...................... H01L 23/481 |
| 2021/0202392 A1* | 7/2021 | Kung ..................... H01L 25/105 |

* cited by examiner

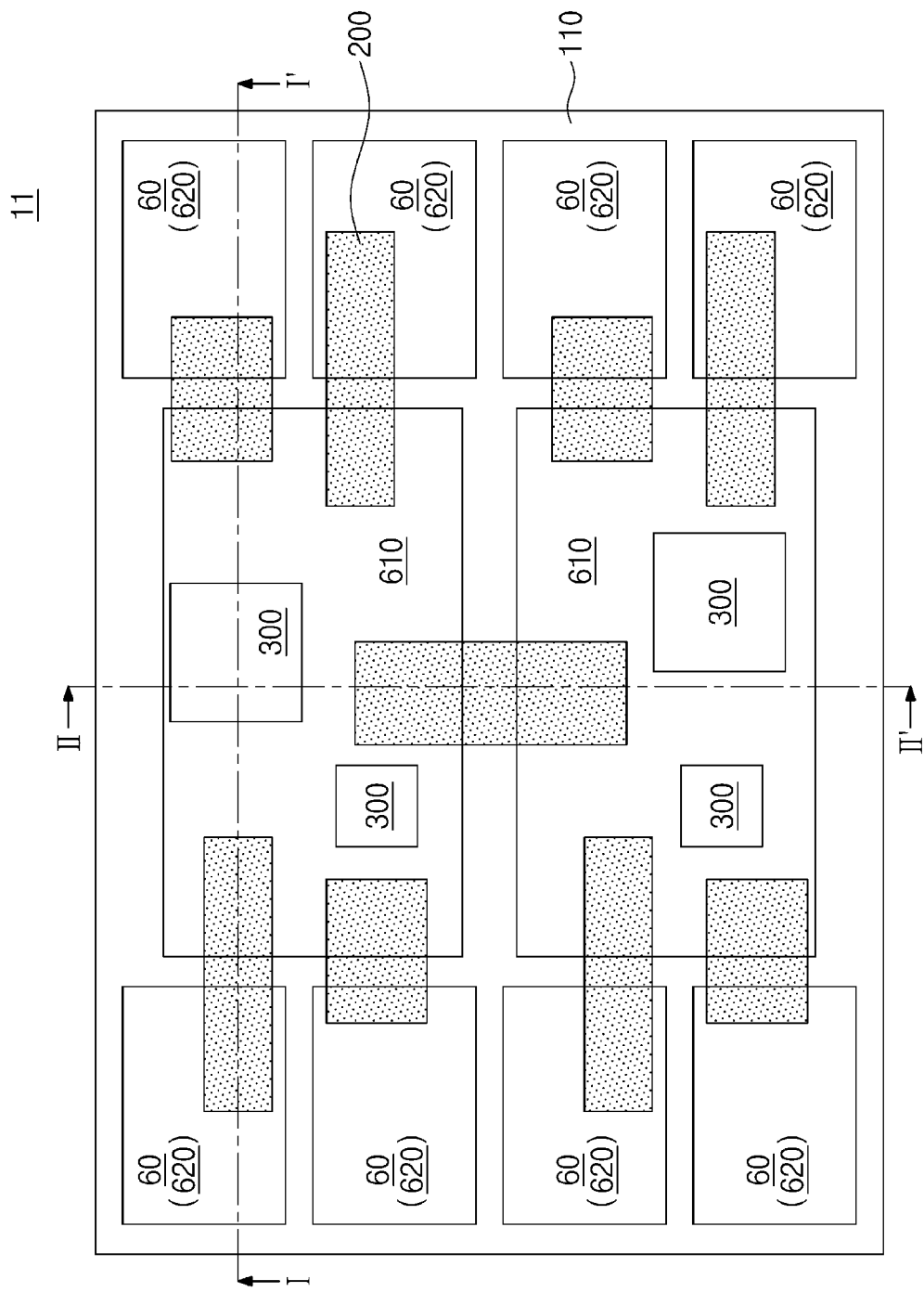

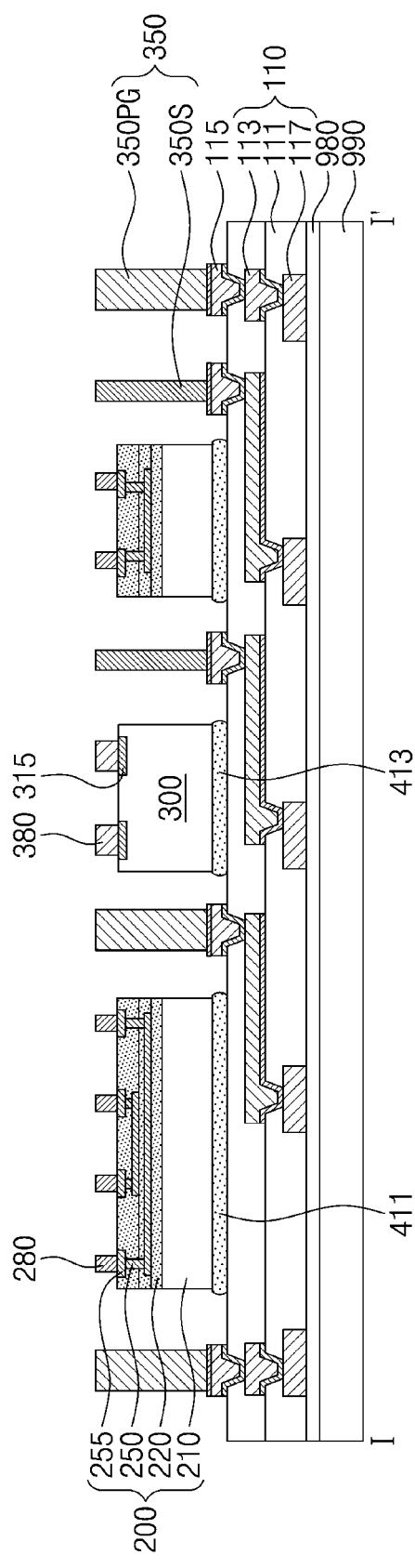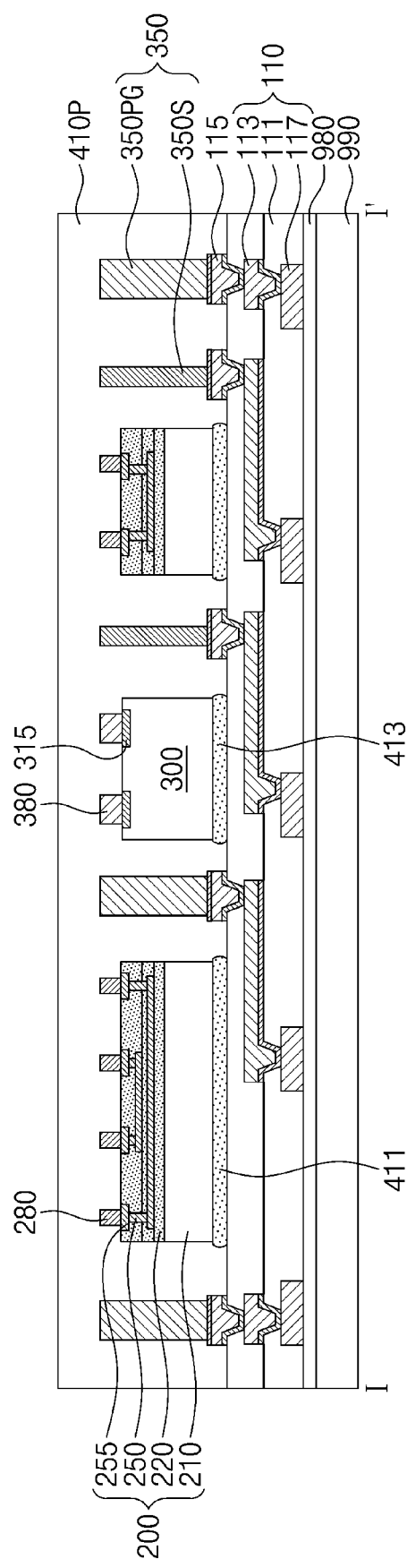

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2021-0039589, filed on Mar. 26, 2021, in the Korean Intellectual Property Office, the entire contents of which are hereby incorporated by reference.

BACKGROUND OF THE INVENTION

The present disclosure relates to a semiconductor package and in particular to a semiconductor package including a redistribution substrate and a method of fabricating the same.

A semiconductor package is a structure that is configured to easily use a semiconductor chip as a part of an electronic product. Conventionally, the semiconductor package includes a printed circuit board (PCB) and a semiconductor chip, which is mounted on the PCB and is electrically connected to the PCB using bonding wires or bumps. With development of the electronic industry, many studies are being conducted to realize a highly reliable, highly integrated and small size semiconductor package.

SUMMARY

An embodiment of the inventive concept provides a semiconductor package with improved electrical and reliability characteristics and a method of fabricating the same.

An embodiment of the inventive concept provides a semiconductor package with a reduced size and a method of fabricating the same.

According to an embodiment of the inventive concept, a semiconductor package may include a first redistribution layer, a passive device disposed on a top surface of the first redistribution layer, a bridge structure disposed on the top surface of the first redistribution layer and laterally spaced apart from the passive device, a second redistribution layer disposed on and electrically connected to the passive device and the bridge structure, conductive structures disposed between the first redistribution layer and the second redistribution layer and laterally spaced apart from the passive device and the bridge structure, a first semiconductor chip mounted on a top surface of the second redistribution layer, and a second semiconductor chip mounted on the top surface of the second redistribution layer. The conductive structures may include a signal structure having a first width and a ground/power structure laterally spaced apart from the signal structure. The ground/power structure may have a second width larger than the first width.

According to an embodiment of the inventive concept, a semiconductor package may include a first redistribution layer, first passive devices disposed on a top surface of the first redistribution layer, a bridge structure disposed on the top surface of the first redistribution layer and laterally spaced apart from the first passive devices, a second redistribution layer disposed on the first passive device and the bridge structure and electrically connected to the first passive devices and the bridge structure, a conductive structure disposed between the first redistribution layer and the second redistribution layer and laterally spaced apart from the first passive devices and the bridge structure, a first semiconductor chip mounted on a top surface of the second redistribution layer, and chip stacks mounted on the top surface of the second redistribution layer and laterally spaced apart from the first semiconductor chip. Each of the chip stacks may include a plurality of stacked second semiconductor chips. The second semiconductor chips may be of a different kind from the first semiconductor chip, and the bridge structure may be electrically connected to the first semiconductor chip and one of the chip stacks. Each of the first passive devices may be overlapped with the first semiconductor chip, when viewed in a plan view, and the first passive devices may be spaced apart from the chip stack, when viewed in a plan view.

According to an embodiment of the inventive concept, a semiconductor package may include a first redistribution layer including a first seed pattern and a first conductive pattern on the first seed pattern, solder terminals disposed on a bottom surface of the first redistribution layer, passive devices disposed on a top surface of the first redistribution layer, adhesive films interposed between the first redistribution layer and the passive devices, respectively, a bridge structure disposed on the top surface of the first redistribution layer and laterally spaced apart from the passive devices, a second redistribution layer disposed on the passive structure and the bridge structure, the second redistribution layer including a second seed pattern and a second conductive pattern on the second seed pattern, first pillar patterns interposed between and electrically connected to the bridge structure and the second redistribution layer, second pillar patterns interposed between the passive devices and the second redistribution layer, conductive structures disposed between the first redistribution layer and the second redistribution layer and laterally spaced apart from the passive device and the bridge structure, a lower mold layer provided in a gap region between the first redistribution layer and the second redistribution layer to cover side surfaces of the passive devices, side surfaces of the bridge structure, and side surfaces of the conductive structures, a first semiconductor chip mounted on a top surface of the second redistribution layer, first bonding bumps between the second redistribution layer and the first semiconductor chip, chip stacks mounted on the top surface of the second redistribution layer and laterally spaced apart from the first semiconductor chip, each of the chip stacks including a plurality of stacked second semiconductor chips, and second bonding bumps between the second redistribution layer and the chip stacks. The first semiconductor chip may be disposed between the chip stacks, when viewed in a plan view, and the second semiconductor chips may be of a different kind from the first semiconductor chip. The bridge structure may be overlapped with the first semiconductor chip and one of the chip stacks, when viewed in a plan view, and each of the passive devices may be overlapped with the first semiconductor chip, when viewed in a plan view, and may be electrically connected to the first semiconductor chip. The passive devices may be spaced apart from the chip stack, when viewed in a plan view.

BRIEF DESCRIPTION OF THE DRAWINGS

FIG. 1A is a plan view illustrating a semiconductor package according to an embodiment of the inventive concept.

FIGS. 5A to 5H are sectional views illustrating a method of fabricating a semiconductor package according to an embodiment of the inventive concept.

DETAILED DESCRIPTION

Figure 1B:
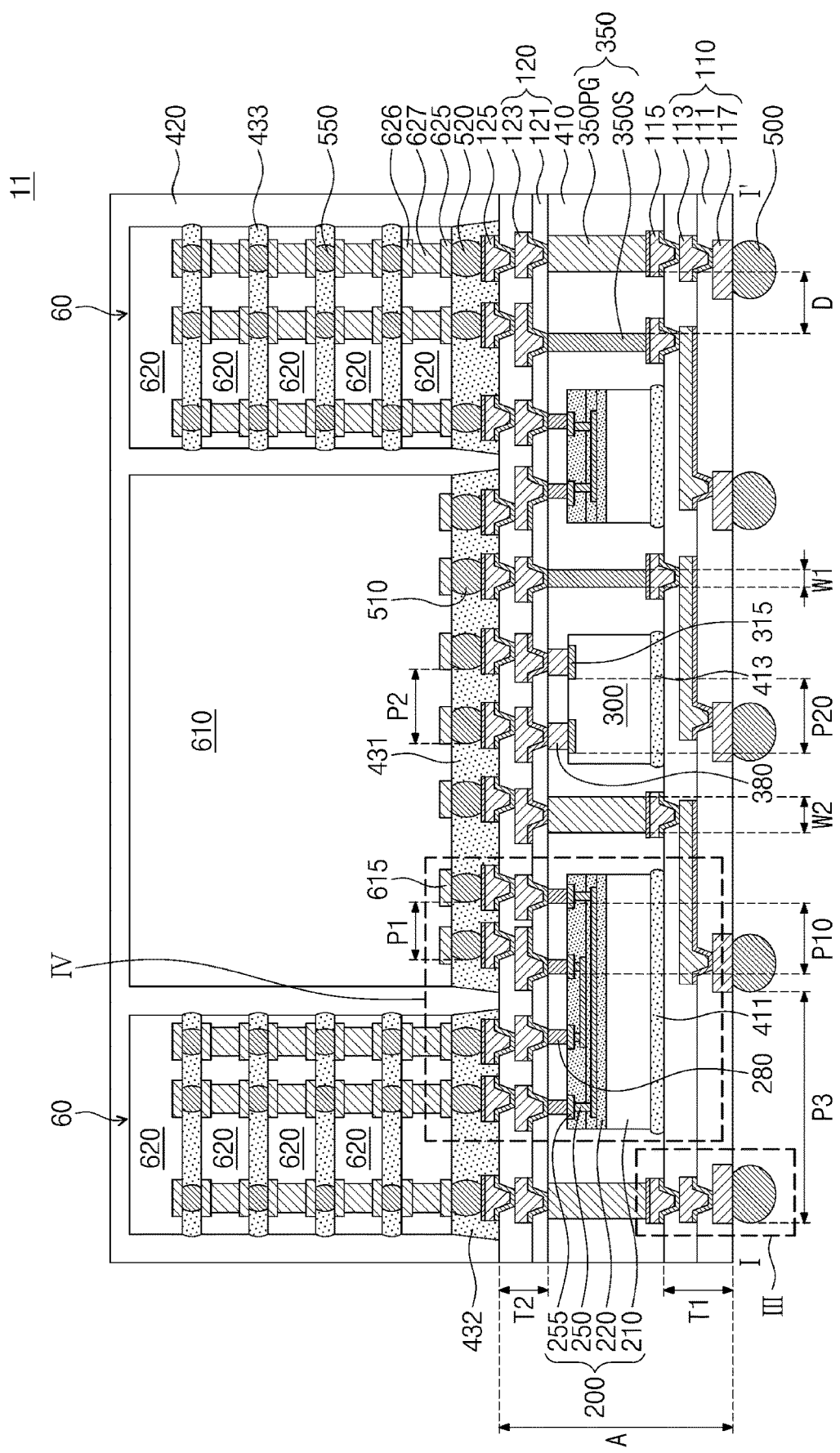
FIG. 1B is a sectional view taken along a line I-I' of FIG. 1A.

Example embodiments of the inventive concepts will now be described more fully with reference to the accompanying drawings, in which example embodiments are shown. Like reference numerals in the drawings denote like elements, and thus their description will be omitted.

Figure 1C:
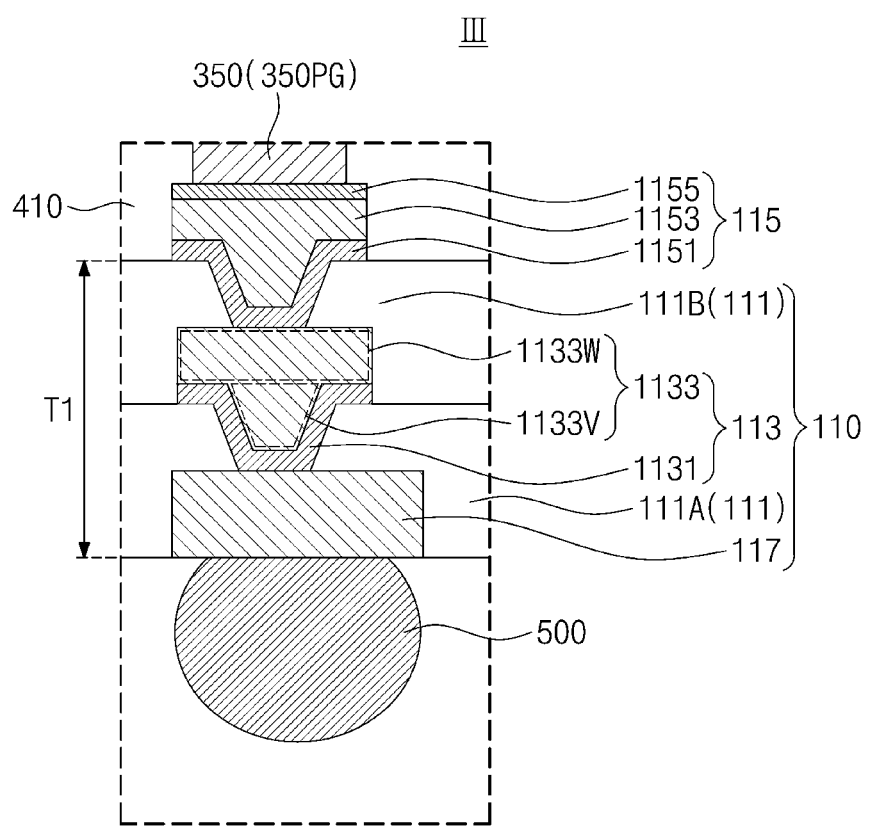
FIG. 1C is an enlarged sectional view of a portion III of FIG. 1B.
Figure 1D:
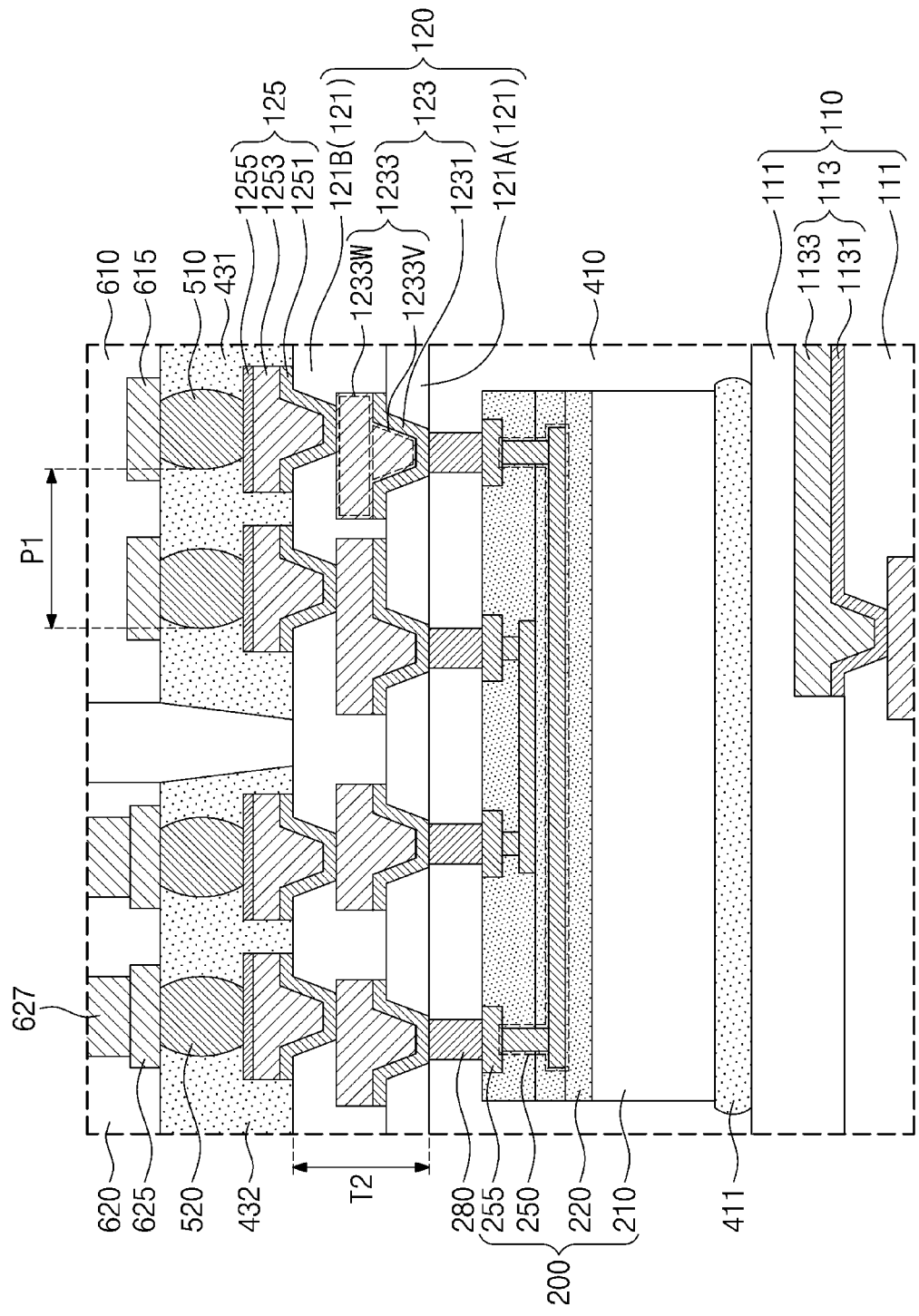
FIG. 1D is an enlarged sectional view of a portion IV of FIG. 1B.
Figure 1E:
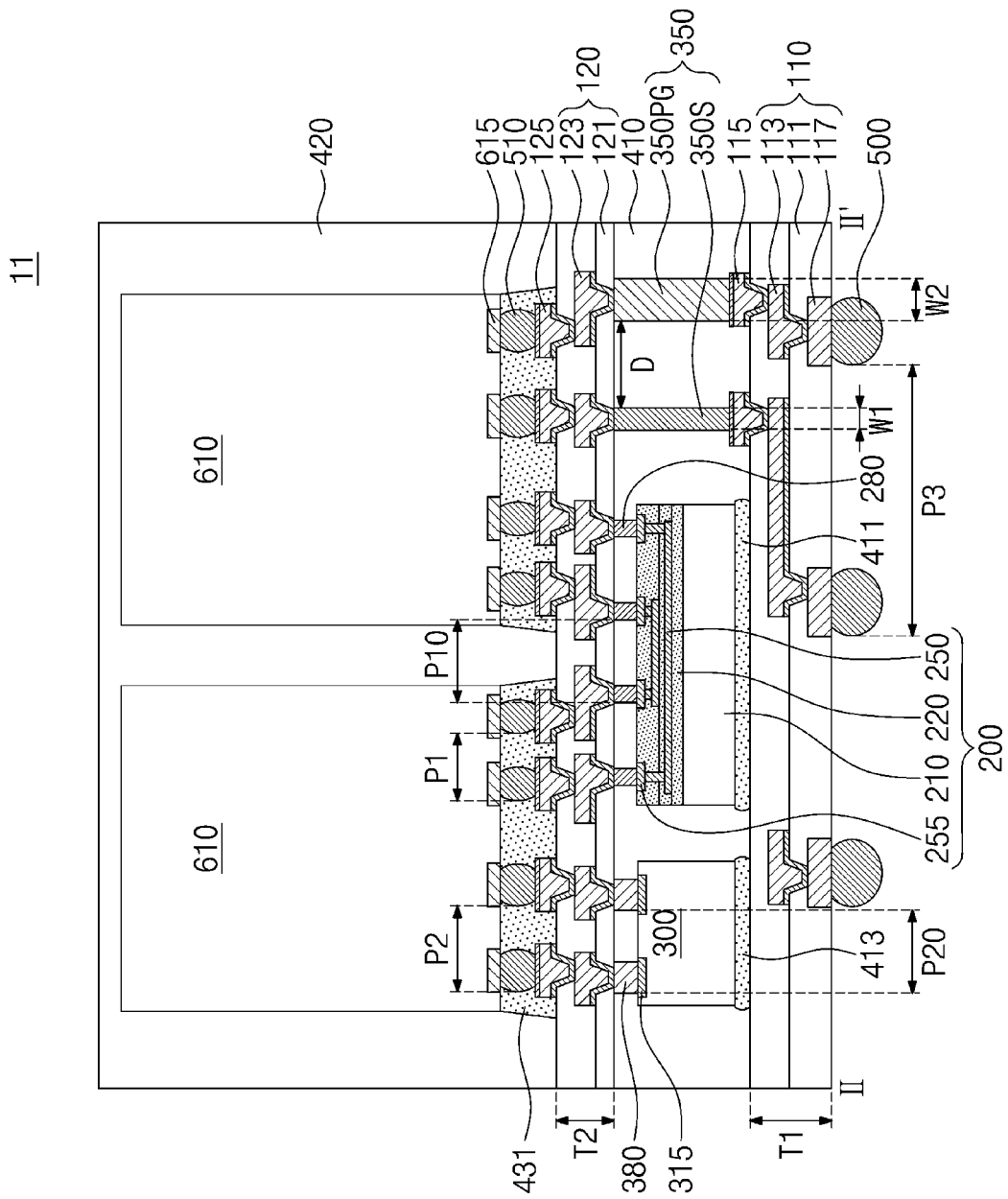
FIG. 1E is a sectional view taken along a line II-II' of FIG. 1A.

FIG. 1A is a plan view illustrating a semiconductor package according to an embodiment of the inventive concept. FIG. 1B is a sectional view taken along a line I-I' of FIG. 1A. FIG. 1C is an enlarged sectional view of a portion III of FIG. 1B. FIG. 1D is an enlarged sectional view of a portion IV of FIG. 1B. FIG. 1E is a sectional view taken along a line II-II' of FIG. 1A.

Referring to FIGS. 1A to 1E, a semiconductor package 11 may include an interposer structure, solder terminals 500, a first semiconductor chip 610, and a chip stack 60. The interposer structure may include a first redistribution layer 110, first redistribution pads 115, a second redistribution layer 120, second redistribution pads 125, a bridge structure 200, a passive device 300, and conductive structures 350.

The first redistribution layer 110 may include a first insulating layer 111, under-bump patterns 117, and first redistribution patterns 113. The first insulating layer 111 may be formed of or include at least one of organic materials (e.g., photosensitive polymers). In the present specification, the photosensitive polymer may include at least one of, for example, photo-sensitive polyimide, polybenzoxazole, phenol-based polymer, or benzocyclobutene-based polymer. The first insulating layer 111 may include a plurality of stacked layers. For example, as shown in FIG. 1C, the first insulating layer 111 may include a first lower insulating layer 111A and a first upper insulating layer 111B. The first upper insulating layer 111B may be disposed on, and in contact with, the first lower insulating layer 111A. The first lower insulating layer 111A and the first upper insulating layer 111B may be provided to have no observable interface therebetween. The first lower insulating layer 111A may be the lowermost layer of the first insulating layers 111. The first upper insulating layer 111B may be the uppermost layer of the first insulating layers 111. The number of the stacked layers constituting the first insulating layers 111 may be variously changed. For example, an additional insulating layer may be further interposed between the first lower insulating layer 111A and the first upper insulating layer 111B.

The under-bump patterns 117 may be provided in the first lower insulating layer 111A. Bottom surfaces of the under-bump patterns 117 may not be covered with the first lower insulating layer 111A. The under-bump patterns 117 may serve as pads of the solder terminals 500. The under-bump patterns 117 may be laterally spaced apart from each other and may be electrically disconnected from each other. Here, the expression "two elements are laterally spaced apart from each other" may mean that the elements are horizontally spaced apart from each other. Here, the term "horizontal or horizontally" is used to represent a direction or plane parallel to a bottom surface of the lowermost one of the first insulating layers 111. For example, the direction or plane parallel to a bottom surface of the lowermost one of the first insulating layers 111 may be referred to as a "first direction." The first lower insulating layer 111A may cover top and side surfaces of the under-bump patterns 117. The under-bump patterns 117 may be formed of or include at least one of metallic materials (e.g., copper).

The first redistribution patterns 113 may be provided on the under-bump patterns 117, respectively. The first redistribution patterns 113 may be laterally spaced apart from each other and may be electrically separated from each other. Referring to FIG. 1C, each of the first redistribution patterns 113 may include a first seed pattern 1131 and a first conductive pattern 1133. The first conductive pattern 1133 may include two portions, one of which is provided on the top surface of the first lower insulating layer 111A, and the other of which is provided in the first lower insulating layer 111A. The first conductive pattern 1133 may include a first via portion 1133V and a first wire portion 1133W. The first via portion 1133V may be disposed in the first lower insulating layer 111A. The first via portion 1133V may be disposed between the under-bump pattern 117 and the first wire portion 1133W. The first wire portion 1133W may be provided on the first via portion 1133V and may be directly connected to the first via portion 1133V. The first wire portion 1133W may be extended to a region on the top surface of the first lower insulating layer 111A and may have a long axis extending in the first direction. The first direction may be parallel to a bottom surface of the first lower insulating layer 111A. The first wire portion 1133W may have a width in the first direction that is larger than a width of the first via portion 1133V in the first direction. The first conductive pattern 1133 may be formed of or include at least one of metallic materials (e.g., copper). In the present specification, the via portion may be an element for vertical interconnection, and the wire portion may be an element for horizontal interconnection. The term "vertical" is used to represent a direction or plane that it is perpendicular to the bottom surface of the lowermost one of the first insulating layers 111. For example, the direction or plane that it is perpendicular to the bottom surface of the lowermost one of the first insulating layers 111 may be referred to as a "second direction." The via portion may be an element for vertical interconnection in a second direction. The first upper insulating layer 111B may cover the side and top surfaces of the first wire portion 1133W, on the first lower insulating layer 111A. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The first seed pattern 1131 may be interposed between the under-bump pattern 117 and the first conductive pattern 1133 and between the first lower insulating layer 111A and the first conductive pattern 1133. The first seed pattern 1131 may cover bottom and side surfaces of the first via portion 1133V and a bottom surface of the first wire portion 1133W. The first seed pattern 1131 may not be extended to a region on a side surface of the first wire portion 1133W. The first seed pattern 1131 may be formed of or include a material that is different from the under-bump pattern 117 and the first conductive pattern 1133. For example, the first seed pattern 1131 may be formed of or include at least one conductive material (e.g., copper, titanium, and/or alloys thereof).

Although not illustrated in the drawings, lower redistribution patterns (not shown) may be further interposed between the under-bump patterns 117 and the first redistribution patterns 113. The stacking number of the lower redistribution patterns may be variously changed.

The first redistribution layer 110 may have a first thickness T1. A thickness of an element may be a length of the element measured in a direction that is substantially perpendicular to a bottom surface of the element. For example, a thickness of an element may be a length of the element measured in the second direction. The thickness of the element may correspond to a distance between the bottom and top surfaces of the element. For example, the first thickness T1 may correspond to a distance between the bottom surface of the lowermost one of the first insulating layers 111 and the top surface of the uppermost one of the first insulating layers 111. The first thickness T1 may have a value selected from a range between 10 μm and 30 μm.

The solder terminals 500 may be disposed on a bottom surface of the first redistribution layer 110. For example, the solder terminals 500 may be disposed on the bottom surfaces of the under-bump patterns 117, respectively, and may be directly coupled to the under-bump patterns 117, respectively. The solder terminals 500 may be electrically connected to the first redistribution patterns 113 through the under-bump patterns 117. The solder terminals 500 may be electrically disconnected from each other. The solder terminals 500 may be formed of or include at least one of varying soldering materials. For example, the soldering materials may include tin, bismuth, lead, silver, or alloys thereof. Since the first thickness T1 is larger than or equal to 10 μm, the solder terminals 500 may be stably connected to the first redistribution layer 110.

The first redistribution pads 115 may be disposed on the first upper insulating layer 111B. The first redistribution pads 115 may be laterally spaced apart from each other. The first redistribution pads 115 may be disposed on and coupled to the first redistribution patterns 113, respectively. As illustrated for example in FIG. 1B, since the first redistribution patterns 113 are provided between the first redistribution pads 115 and the under-bump patterns 117, at least one of the first redistribution pads 115 may not be vertically aligned to the under-bump pattern 117 that it is electrically connected thereto. Accordingly, the under-bump patterns 117 or the first redistribution pads 115 may be designed and disposed with an increased degree of freedom.

Each of the first redistribution pads 115 may include a first seed pad 1151, a first pad pattern 1153, and a first bonding pad 1155, as shown in FIG. 1C. A lower portion of the first pad pattern 1153 may be provided in the first upper insulating layer 111B. An upper portion of the first pad pattern 1153 may be disposed on a top surface of the first upper insulating layer 111B. The upper portion of the first pad pattern 1153 may have a larger width in the first direction than the lower portion thereof and may be connected to the lower portion thereof. The first pad pattern 1153 may be formed of or include at least one of metallic materials (e.g., copper). The first seed pad 1151 may be interposed between the first redistribution pattern 113 and the first pad pattern 1153 and between the first upper insulating layer 111B and the first pad pattern 1153. The first seed pad 1151 may be formed of or include at least one of conductive materials (e.g., copper, titanium, and/or alloys thereof). The first bonding pad 1155 may be disposed on the first pad pattern 1153. The first bonding pad 1155 may be formed of or include a metallic material that is different from the first pad pattern 1153. For example, the first bonding pad 1155 may be formed of or include at least one of other metallic materials, such as nickel, gold, and/or alloys thereof. The first bonding pad 1155 may serve as a protection layer or an adhesive layer.

Referring to FIGS. 1B and 1D, the bridge structure 200 may be disposed on the top surface of the first redistribution layer 110. The top surface of the first redistribution layer 110 may correspond to a top surface of the uppermost one of the first insulating layers 111. The bridge structure 200 may include a base substrate 210, insulating patterns 220, a connection structure 250, and connection pads 255. The bridge structure 200 may include integrated circuits, but the inventive concept is not limited to this example. The base substrate 210 may be a semiconductor substrate, such as a silicon wafer. As another example, the base substrate 210 may include an organic substrate. The organic substrate may be formed of or include an insulating polymer. The insulating patterns 220 may be vertically stacked on a top surface of the base substrate 210. The insulating patterns 220 may be formed of or include at least one of silicon-based insulating materials or organic insulating materials. The silicon-based insulating materials may include, for example, silicon oxide, silicon nitride, silicon oxynitride, silicon carbon oxide, and/or combinations thereof. The organic insulating materials may include insulating polymers.

The connection pads 255 may be disposed in the uppermost of the insulating patterns 220 or on the uppermost of the insulating patterns 220. The top surfaces of the connection pads 255 may not be covered with the uppermost of the insulating patterns 220. The connection pads 255 may be laterally spaced apart from each other. The connection pads 255 may be formed of or include at least one of metallic materials (e.g., copper, aluminum, and/or tungsten). The connection structure 250 may be provided in the insulating patterns 220 and may be connected to at least two connection pads 255. In an embodiment, a plurality of the connection structures 250 may be provided to be electrically disconnected from each other. Each of the connection structures 250 may include conductive vias and a conductive interconnection line. The conductive vias may be respectively interposed between the conductive interconnection line and the connection pads 255. The expression "an element is coupled to the bridge structure 200" may mean that the element is coupled to the connection structure 250. The connection structure 250 may be formed of or include at least one of metallic materials (e.g., copper, titanium, and/or tungsten).

A height of the bridge structure 200 in the second direction may have a value selected from a range between 30 μm and 150 μm. A height of an element may correspond to a distance between the bottom and top surfaces of the element. For example, the height of the bridge structure 200 may be a distance between the bottom surface of the base substrate 210 and the top surfaces of the connection pads 255.

A first adhesive film 411 may be interposed between the first redistribution layer 110 and the bridge structure 200. The bridge structure 200 may be stably fastened to the first redistribution layer 110 by the first adhesive film 411. The first adhesive film 411 may have an insulating property. The first adhesive film 411 may include a die attach film (DAF). A thickness of the first adhesive film 411 in the second direction may be smaller than the height of the bridge structure 200. The thickness of the first adhesive film 411 may have a value selected from a range between 3 μm and 25 μm.

The passive device 300 (e.g., wire, resistor, capacitor, inductor, transformer, diode, etc.) may be disposed on a top surface of the first insulating layer 111 and may be laterally spaced apart from the bridge structure 200. A height of the passive device 300 may have a value selected from a range between about 30 μm and 150 μm. Terminals 315 may be provided on a top surface of the passive device 300. The terminals 315 may be formed of or include at least one of conductive materials (e.g., metallic materials).

A second adhesive film 413 may be interposed between the first redistribution layer 110 and the passive device 300. The passive device 300 may be attached to the second redistribution layer 120 through the second adhesive film 413. The second adhesive film 413 may have an insulating property. The second adhesive film 413 may be a die attach film. A thickness of the second adhesive film 413 in the second direction may be smaller than the height of the passive device 300. The thickness of the second adhesive film 413 may have a value selected from a range between 3 μm and 25 μm.

The second redistribution layer 120 may be disposed on the bridge structure 200, the passive device 300, and the conductive structures 350. The second redistribution layer 120 may be vertically spaced apart from the first redistribution layer 110. The second redistribution layer 120 may include second insulating layers 121 and second redistribution patterns 123. The second insulating layers 121 may be vertically stacked. However, adjacent ones of the second insulating layers 121 may be provided to have no observable interface therebetween. In an embodiment, the second insulating layer 121 may include a second lower insulating layer 121A and a second upper insulating layer 121B, as shown in FIG. 1D. The second upper insulating layer 121B may be disposed on the second lower insulating layer 121A. The number of the staked second insulating layers 121 may be variously changed. For example, an additional insulating layer may be further interposed between the second lower insulating layer 121A and the second upper insulating layer 121B. The second insulating layers 121 may be formed of or include at least one of organic materials (e.g., photosensitive polymers).

The second redistribution patterns 123 may be spaced apart from each other and may be electrically disconnected from each other. Each of the second redistribution patterns 123 may include a second seed pattern 1231 and a second conductive pattern 1233. The second conductive pattern 1233 may be disposed on the second seed pattern 1231. The second conductive pattern 1233 may include a second via portion 1233V and a second wire portion 1233W. The second via portion 1233V may be disposed in the second insulating layer 121. The second wire portion 1233W may be provided on the second via portion 1233V and may be connected to the second via portion 1233V without any interface therebetween. The second wire portion 1233W may have a width or length in the first direction that is larger than a width of the second via portion 1233V in the first direction. The second wire portion 1233W may be extended to a region on a top surface of the second insulating layer 121. The second conductive pattern 1233 may be formed of or include at least one of metallic materials (e.g., copper).

The second seed pattern 1231 may cover bottom and side surfaces of the second via portion 1233V and a bottom surface of the second wire portion 1233W. The second seed pattern 1231 may not be extended to a region on a side surface of the second wire portion 1233W. The second seed pattern 1231 may be formed of or include a material that is different from the second conductive pattern 1233. For example, the second seed pattern 1231 may be formed of or include at least one of metallic materials, such as copper, titanium, and/or alloys thereof.

The second upper insulating layer 121B may be provided on the second lower insulating layer 121A to cover the side and top surfaces of the second wire portion 1233W. Although not illustrated in the drawings, upper redistribution patterns may be further provided on the second redistribution patterns 123. The stacking number of the upper redistribution patterns may be variously changed.

The second redistribution layer 120 may have a second thickness T2 in the second direction. The second thickness T2 may correspond to a distance between a bottom surface of the lowermost one of the second insulating layers 121 and a top surface of the uppermost one of the second insulating layers 121. Here, the lowermost one of the second insulating layers 121 may be the second lower insulating layer 121A, and the uppermost one of the second insulating layers 121 may be the second upper insulating layer 121B. The second thickness T2 may be equal to or smaller than the first thickness T1. The second thickness T2 may have a value selected from a range between 3 μm and 20 μm.

A distance A between the bottom surface of the first redistribution layer 110 and the top surface of the second redistribution layer 120 may have a value selected from a range between 60 μm and 300 μm. Since the distance A is larger than 60 μm, the passive device 300 and the bridge structure 200 may be interposed between the first redistribution layer 110 and the second redistribution layer 120. Since the distance A is smaller than 300 μm, a length of an electric conduction path between the first semiconductor chip 610 and the solder terminals 500 may be reduced.

The second redistribution pads 125 may be disposed on the second upper insulating layer 121B. The second redistribution pads 125 may be laterally spaced apart from each other. The second redistribution pads 125 may be disposed on and coupled to the second redistribution patterns 123, respectively.

Each of the second redistribution pads 125 may include a second seed pad 1251, a second pad pattern 1253, and a second bonding pad 1255. A lower portion of the second pad pattern 1253 may be provided in the second upper insulating layer 121B. An upper portion of the second pad pattern 1253 may be disposed on a top surface of the second upper insulating layer 121B. The upper portion of the second pad pattern 1253 may have a larger width than the lower portion thereof and may be connected to the lower portion thereof. The second pad pattern 1253 may be formed of or include at least one of metallic materials (e.g., copper). The second seed pad 1251 may be interposed between the second redistribution pattern 123 and the second pad pattern 1253 and between the second upper insulating layer 121B and the second pad pattern 1253. The second seed pad 1251 may be formed of or include at least one of conductive materials (e.g., copper, titanium, and/or alloys thereof). The second bonding pad 1255 may be disposed on the second pad pattern 1253. The second bonding pad 1255 may be formed of or include a metallic material that is different from the second pad pattern 1253. For example, the second bonding pad 1255 may be formed of or include at least one of nickel, gold, and/or alloys thereof. The second bonding pad 1255 may be used as a protection layer or an adhesive layer.

The first semiconductor chip 610 may be mounted on the top surface of the second redistribution layer 120, as shown in FIG. 1B. The first semiconductor chip 610 may be disposed on a center region of the second redistribution layer 120, when viewed in a plan view. The first semiconductor chip 610 may include integrated circuits (not shown) and chip pads 615. The integrated circuits of the first semiconductor chip 610 may be provided in the first semiconductor chip 610. The chip pads 615 may be disposed on a bottom surface of the first semiconductor chip 610 and may be electrically connected to the integrated circuits. The expression "an element is coupled or connected to the chip pads 615" may mean that the element is coupled or connected to the first semiconductor chip 610. The first semiconductor chip 610 may be one of a logic chip, a buffer chip, and a system-on-chip (SOC). In an embodiment, the first semiconductor chip 610 may be an application specific integrated circuit (ASIC) chip or an application processor (AP) chip. The ASIC chip may include an application specific integrated circuit. In another embodiment, the first semiconductor chip 610 may include a central processing unit (CPU) or a graphic processing unit (GPU).

First bonding bumps 510 may be provided between the chip pads 615 of the first semiconductor chip 610 and the second redistribution pads 125 and may be coupled to the chip pads 615 and the second redistribution patterns 123, respectively. Accordingly, the first semiconductor chip 610 may be coupled to the second redistribution patterns 123 through the first bonding bumps 510. The expression "an element is coupled to the second redistribution layer 120" may mean that the element is coupled or connected to at least one of the second redistribution patterns 123. Each of the first bonding bumps 510 may include at least one of a solder ball, a solder pillar, and/or combinations thereof. The first bonding bumps 510 may be formed of or include at least one of soldering materials or copper.

The chip stack 60 may be mounted on the top surface of the second redistribution layer 120. The chip stack 60 may be disposed on a top surface of an edge region of the second redistribution layer 120. When viewed in a plan view, the edge region of the second redistribution layer 120 may be provided between a side surface and the center region of the second redistribution layer 120. The edge region of the second redistribution layer 120 may enclose the center region. The chip stack 60 may be laterally spaced apart from the first semiconductor chip 610. In an embodiment, a plurality of the chip stacks 60 may be provided, and in this case, the first semiconductor chip 610 may be disposed between the chip stacks 60, when viewed in a plan view. The number of the chip stacks 60 may be variously changed. For example, the semiconductor package 11 may include just one chip stack 60.

Each of the chip stacks 60 may include a plurality of second semiconductor chips 620, which are sequentially stacked in the second direction. The second semiconductor chips 620 may include integrated circuits provided therein. The second semiconductor chips 620 may be of a different kind from the first semiconductor chip 610. For example, the lowermost one of the second semiconductor chips 620 may be a logic chip, and the others may be memory chips. The memory chip may include a high bandwidth memory (HBM) chip. The lowermost one of the second semiconductor chips 620 may be a logic chip which is of a different kind from the first semiconductor chip 610. As an example, the lowermost one of the second semiconductor chips 620 may be a controller chip which is configured to control memory chips. As another example, the lowermost one of the second semiconductor chips 620 may be a memory chip.

Each of the second semiconductor chips 620 may include lower pads 625, penetration electrodes 627, and upper pads 626. The lower pads 625 and the upper pads 626 may be provided on bottom and top surfaces, respectively, of the second semiconductor chip 620. The lower pads 625 and the upper pads 626 may be electrically connected to integrated circuits, which are provided in a corresponding one of the second semiconductor chips 620. The penetration electrodes 627 may be disposed in a corresponding one of the second semiconductor chips 620 and may be coupled to the lower pads 625 and the upper pads 626, respectively. The uppermost one of the second semiconductor chips 620 may include the lower pads 625 but may not include the penetration electrodes 627 and the upper pads 626. A thickness of the uppermost one of the second semiconductor chips 620 in the second direction may be larger than the respective thickness of the remaining ones of the second semiconductor chips 620 in the second direction.

Each of the chip stacks 60 may further include interposer bumps 550. The interposer bumps 550 may be interposed between two adjacent ones of the second semiconductor chips 620 and may be respectively coupled to the lower pads 625 and the upper pads 626. Accordingly, the second semiconductor chips 620 may be electrically connected to each other. Each of the interposer bumps 550 may include at least one of a solder ball, a solder pillar, and/or combinations thereof. The interposer bumps 550 may be formed of or include at least one of soldering materials or copper, but the inventive concept is not limited to this example. As another example, the interposer bumps 550 may be omitted. In this case, the lower pads 625 and the upper pads 626, which are respectively included in adjacent semiconductor chips and are placed to face each other, may be directly bonded to each other.

Each of the chip stacks 60 may further include upper under-fill layers 433. The upper under-fill layers 433 may be respectively provided in third gap regions between the second semiconductor chips 620 to hermetically seal the interposer bumps 550. The upper under-fill layer 433 may be formed of or include an insulating polymer (e.g., epoxy-based polymers).

Second bonding bumps 520 may be interposed between the lowermost one of the second semiconductor chips 620 and the second redistribution layer 120 and may be respectively coupled to corresponding ones of the lower pads 625 and the second redistribution pads 125. Accordingly, the second semiconductor chips 620 may be coupled to the second redistribution patterns 123. Each of the second bonding bumps 520 may include at least one of a solder ball, a solder pillar, and/or combinations thereof. The second bonding bumps 520 may be formed of or include at least one of soldering materials or copper, but the inventive concept is not limited to this example.

The semiconductor package 11 may further include a first under-fill layer 431 and second under-fill layers 432. The first under-fill layer 431 may be provided in a first gap region between the second redistribution layer 120 and the first semiconductor chip 610 to hermetically seal the first bonding bumps 510. The first under-fill layer 431 may be formed of or include an insulating polymer (e.g., epoxy-based polymers). The second under-fill layers 432 may be respectively provided in second gap regions between the second redistribution layer 120 and the chip stacks 60 to seal corresponding ones of the second bonding bumps 520. The second under-fill layers 432 may be formed of or include an insulating polymer (e.g., epoxy-based polymers). Although not illustrated in the drawings, the second under-fill layers 432 may be omitted, and the first under-fill layer 431 may be extended into the second gap regions to seal the second bonding bumps 520.

First pillar patterns 280 may be interposed between the bridge structure 200 and the second redistribution layer 120 and may be coupled to the connection pads 255 and the second redistribution patterns 123, respectively. For example, the first pillar patterns 280 may be coupled to bottom surfaces of the second redistribution patterns 123, respectively. The first pillar patterns 280 may be formed of or include at least one of metallic materials (e.g., copper, titanium, and/or alloys thereof). A pitch P10 of the first pillar patterns 280 may be smaller than a pitch P3 of the solder terminals 500.

The bridge structure 200 may be overlapped with the first semiconductor chip 610 and one of the chip stacks 60 in the second direction, when viewed in a plan view. Each of the chip stacks 60 may be coupled to a corresponding one of the bridge structures 200 through the second redistribution layer 120 and the first pillar patterns 280. The expression "an element is electrically connected to the chip stack 60" may mean that the element is electrically connected to at least one of the second semiconductor chips 620. The second semiconductor chips 620 may be coupled to the bridge structure 200 through the second redistribution layer 120 and the first pillar patterns 280. The first semiconductor chip 610 and the second semiconductor chips 620 may be electrically connected to each other through the first redistribution pattern 113 and the connection structure 250.

In the case where the bridge structure 200 is omitted, the first and second semiconductor chips 610 and 620 may be electrically connected to each other through the second redistribution layer 120, and in this case, it may be necessary to increase the second thickness T2. According to an embodiment of the inventive concept, not only the second redistribution layer 120 but also the bridge structure 200 may be used as an electrical connection path between the first and second semiconductor chips 610 and 620. Accordingly, the second thickness T2 may be reduced. For example, the second thickness T2 may have a value selected from a range between 3 μm and 20 μm.

Since the first pillar patterns 280 has a relatively small pitch (e.g., the pitch P10), it may be possible to increase an integration density of an electric connection structure between the first and second semiconductor chips 610 and 620 or to realize a dense electric connection structure between the first and second semiconductor chips 610 and 620. For example, the pitch P10 of the first pillar patterns 280 may be smaller than a pitch P20 of second pillar patterns 380, which will be described below, and a distance D between two adjacent ones of the conductive structures 350.

In an embodiment, a plurality of the bridge structures 200 may be provided. The bridge structures 200 may be spaced apart from each other. At least two ones of the bridge structures 200 may have different sizes from each other, but the inventive concept is not limited to this example.

As shown in FIG. 1E, the semiconductor package 11 may include a plurality of the first semiconductor chips 610. The first semiconductor chips 610 may be spaced apart from each other. The first semiconductor chips 610 may be of the same kind. At least one of the bridge structures 200 may be vertically overlapped with the first semiconductor chips 610. The bridge structure 200 may serve as an electric conduction path between the first semiconductor chips 610. For example, the first semiconductor chips 610 may be electrically connected to each other through the first redistribution patterns 113 and the connection structure 250. Although not illustrated in the drawings, the semiconductor package 11 may be configured to have just one first semiconductor chip 610. Hereinafter, one of the first semiconductor chips 610 will be mentioned in the following description, for brevity's sake.

According to an embodiment of the inventive concept, since the passive device 300 is provided at a side of the bridge structure 200, the semiconductor package 11 may have a reduced size and an increased integration density.

The second pillar patterns 380 may be provided between the passive device 300 and the second redistribution layer 120 and may be coupled to the terminals 315 and the second redistribution patterns 123, respectively. For example, the second pillar patterns 380 may be coupled to the bottom surfaces of the second redistribution patterns 123, respectively. The second pillar patterns 380 may be formed of or include at least one of metallic materials (e.g., copper, titanium, and/or alloys thereof). The pitch P20 of the second pillar patterns 380 may be smaller than the pitch P3 of the solder terminals 500.

The passive device 300 may be electrically connected to the first semiconductor chip 610 through the second pillar patterns 380 and the second redistribution layer 120. According to an embodiment of the inventive concept, since the passive device 300 is coupled to the first semiconductor chip 610 through the second redistribution layer 120, it may be possible to reduce a length of an electrical conduction path between the passive device 300 and the first semiconductor chip 610. The passive device 300 may be vertically overlapped with the first semiconductor chip 610. Accordingly, the length of the electrical conduction path between the passive device 300 and the first semiconductor chip 610 may be further reduced, and this may make it possible to improve the electric characteristics of the semiconductor package 11.

In the case where the passive device 300 is embedded in the first redistribution layer 110, the second redistribution layer 120, or the first semiconductor chip 610, a process of fabricating the first redistribution layer 110, the second redistribution layer 120, or the first semiconductor chip 610 may become complex and difficult. By contrast, according to an embodiment of the inventive concept, since the passive device 300 is provided on the first redistribution layer 110, it may be possible to simplify the process of fabricating the first redistribution layer 110, the second redistribution layer 120, or the first semiconductor chip 610. In addition, it may be possible to increase a production yield in the process of fabricating the first redistribution layer 110, the second redistribution layer 120, or the first semiconductor chip 610.

As shown in FIG. 1A, the semiconductor package 11 may include a plurality of the passive devices 300. The passive devices 300 may be laterally spaced apart from each other. The passive devices 300 may be vertically overlapped with the first semiconductor chip 610 and may be electrically connected to the first semiconductor chip 610. The passive devices 300 may not be electrically connected to the second semiconductor chips 620. Each of the passive devices 300 may not be overlapped with the second semiconductor chips 620, when viewed in a plan view. The number of the passive devices 300, which are vertically overlapped with the first semiconductor chip 610, may be greater than the number of the passive devices 300, which are vertically overlapped with the second semiconductor chips 620. Here, the number of the passive devices 300, which are vertically overlapped with the second semiconductor chips 620, may be zero. The sizes of the passive devices 300 may be equal to or different from each other.

The conductive structures 350 may be interposed between the first redistribution layer 110 and the second redistribution layer 120 to electrically connect the first redistribution layer 110 and the second redistribution layer 120 to each other. The conductive structures 350 may be laterally spaced apart from the bridge structure 200 and the passive devices 300. The conductive structures 350 may be laterally spaced apart from each other. The conductive structures 350 may be disposed on and coupled to the first redistribution pads 115, respectively. For example, each of the conductive structures 350 may be in contact with the first bonding pad 115S, as shown in FIG. 1C. The conductive structures 350 may be electrically connected to the solder terminals 500 through the first redistribution layer 110. The expression "an element is electrically connected to the first redistribution layer 110" may mean that the element is electrically connected to at least one of the first redistribution patterns 113. The conductive structures 350 may be formed of or include at least one of metallic materials (e.g., copper, tungsten, and/or alloys thereof).

The conductive structures 350 may include first conductive structures 350S and second conductive structures 350PG. The first conductive structures 350S may be signal structures. The term "signal structure" may indicate a through structure that serves as a path along which data signals propagate and that is electrically connected to a signal source, such as a data, address, or command signal source. For example, the first conductive structures 350S may be used to deliver data signals from the first or second semiconductor chips 610 or 620 to the solder terminals 500.

The second conductive structures 350PG may be spaced apart from and electrically disconnected from the first conductive structures 350S. The second conductive structures 350PG may include at least one of a ground/power structure and a serializer/deserializer (SerDes) structure. The ground/power structure may include at least one of a ground structure and a power structure. The term "ground/power structure" may indicate a through structure that serves as a path along which a ground or power voltage is provided and may be electrically connected to a ground or power source. For example, the second conductive structures 350PG may be conduction paths, which are used to supply a ground voltage or a power voltage to the first or second semiconductor chips 610 or 620. The term "SerDes structure" may indicate a through structure that serves as an electric connection path between a pair of blocks that convert data between serial data and parallel interfaces. One of the pair of blocks may be provided in the first semiconductor chip 610 or second semiconductor chip 620.

A width W2 of the second conductive structures 350PG may be larger than a width W1 of the first conductive structures 350S. For example, the width W2 of the second conductive structures 350PG may be 120% to 300% of the width W1 of the first conductive structures 350S. Since the width W2 of the second conductive structures 350PG is larger than or equal to 120% of the width W1 of the first conductive structures 350S, the second conductive structures 350PG may be used to deliver a larger amount of current than the first conductive structures 350S. Thus, the electric characteristics of the semiconductor package 11 may be improved. Since the width W1 of the first conductive structures 350S is smaller than the width W2 of the second conductive structures 350PG, it may be possible to reduce a size of the semiconductor package 11 and to increase the number of the first conductive structures 350S disposed on the first redistribution layer 110. Thus, it may be possible to improve a data signal transmission property of the first or second semiconductor chips 610 or 620. For example, given an increase in the number of the first conductive structures 350S, a data signal of the first or second semiconductor chips 610 or 620 may be transmitted to an external device through the first conductive structures 350S at a faster speed.

Some of the first bonding bumps 510 may be arranged at a first pitch P1 and others may be arranged at a second pitch P2. The first bonding bumps 510, which are arranged at the first pitch P1, may be coupled to the bridge structures 200. The first bonding bumps 510, which are arranged at the second pitch P2, may be coupled to the conductive structures 350 or the passive device 300. The first pitch P1 may be smaller than the second pitch P2. Accordingly, it may be possible to increase an integration density of an electric connection structure between the first and second semiconductor chips 610 and 620 or between the first semiconductor chips 610 or to realize a dense electric connection structure. However, in an embodiment, the first pitch P1 may be equal to or larger than the second pitch P2.

A lower mold layer 410 may be provided between the first redistribution layer 110 and the second redistribution layer 120 to fill a gap region between the first redistribution layer 110 and the second redistribution layer 120. The lower mold layer 410 may cover the side and top surfaces of the bridge structure 200, the side and top surfaces of the passive device 300, and the side surfaces of the conductive structures 350. The lower mold layer 410 may be extended into a gap region between the bridge structure 200 and the second redistribution layer 120 to seal the first pillar patterns 280. The lower mold layer 410 may be extended into a gap region between the passive device 300 and the second redistribution layer 120 to seal the second pillar patterns 380. The lower mold layer 410 may be formed of or include at least one of insulating polymers (e.g., epoxy molding compound). The lower mold layer 410 may be formed of or include a material that is different from the first adhesive film 411 and the second adhesive film 413.

A top surface of the lower mold layer 410 may be located at substantially the same level in the second direction as top surfaces of the first pillar patterns 280, the second pillar patterns 380, and the conductive structures 350. Accordingly, the second redistribution layer 120 may be easily formed on the lower mold layer 410, and the second redistribution patterns 123 may be well coupled to the first pillar patterns 280, the second pillar patterns 380, and the conductive structures 350. If elements are described to have the same level, thickness, width, or length, the elements may be formed to have levels, thicknesses, widths, or lengths within a specific process tolerance. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. In the present specification, the term 'level' may mean a level in the vertical direction (i.e., the second direction), and the term 'level difference or different between two levels' may be a distance between the two levels, which are measured in a direction perpendicular to the bottom surface of the first redistribution layer 110. Outer side surfaces of the lower mold layer 410 may be aligned to outer side surfaces of the first redistribution layer 110 and outer side surfaces of the second redistribution layer 120.

According to an embodiment of the inventive concept, the semiconductor package 11 may further include an upper mold layer 420. The upper mold layer 420 may be disposed on the top surface of the second redistribution layer 120 to cover a side surface of the first semiconductor chip 610 and side surfaces of the second semiconductor chips 620. The upper mold layer 420 may further cover a top surface of the first semiconductor chip 610 and a top surface of the uppermost one of the second semiconductor chips 620. In an embodiment, the upper mold layer 420 may not cover the top surface of the first semiconductor chip 610 and the top surface of the uppermost one of the second semiconductor chips 620. As another example, the first under-fill layer 431 and the second under-fill layers 432 may be omitted, and the upper mold layer 420 may be extended into the first gap region between the second redistribution layer 120 and the first semiconductor chip 610 and the second gap regions between the second redistribution layer 120 and the chip stacks 60.

Outer side surfaces of the upper mold layer 420 may be aligned to the outer side surfaces of the first redistribution layer 110, the outer side surfaces of the lower mold layer 410, and the outer side surfaces of the second redistribution layer 120.

Although not illustrated in the drawings, the semiconductor package may further include an upper passive device. The upper passive device may be provided in the second redistribution layer 120. For example, the upper passive device may be interposed between a corresponding one of the second redistribution patterns 123 and a corresponding one of the second redistribution pads 125. At least one of the solder terminals 500 may be electrically connected to the first semiconductor chip 610 through the upper passive device. Alternatively, the first semiconductor chip 610 may be electrically connected to the passive device 300 or the bridge structure 200 through the upper passive device.

Figure 2A:
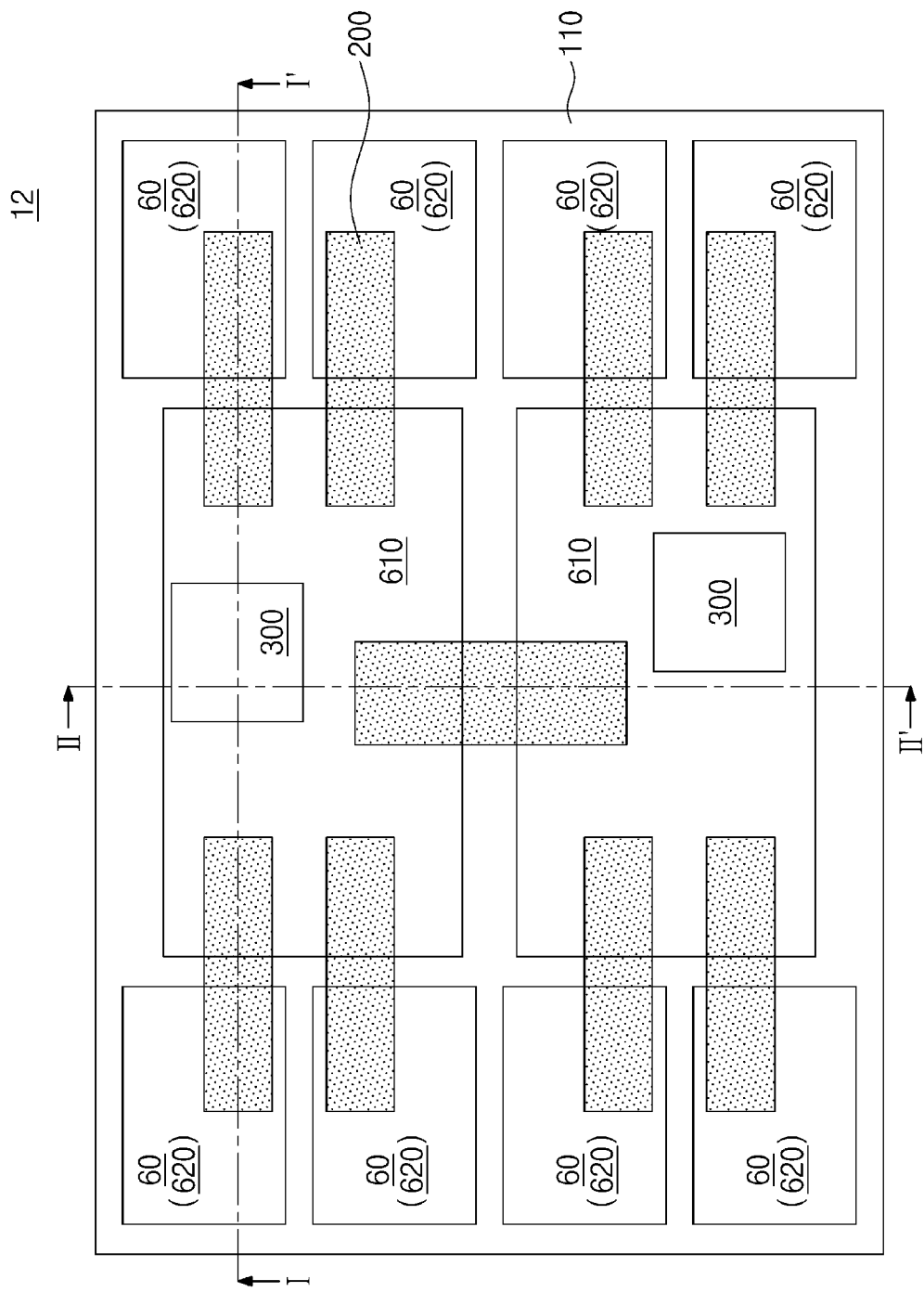
FIG. 2A is a plan view illustrating a semiconductor package according to an embodiment of the inventive concept.
Figure 2B:
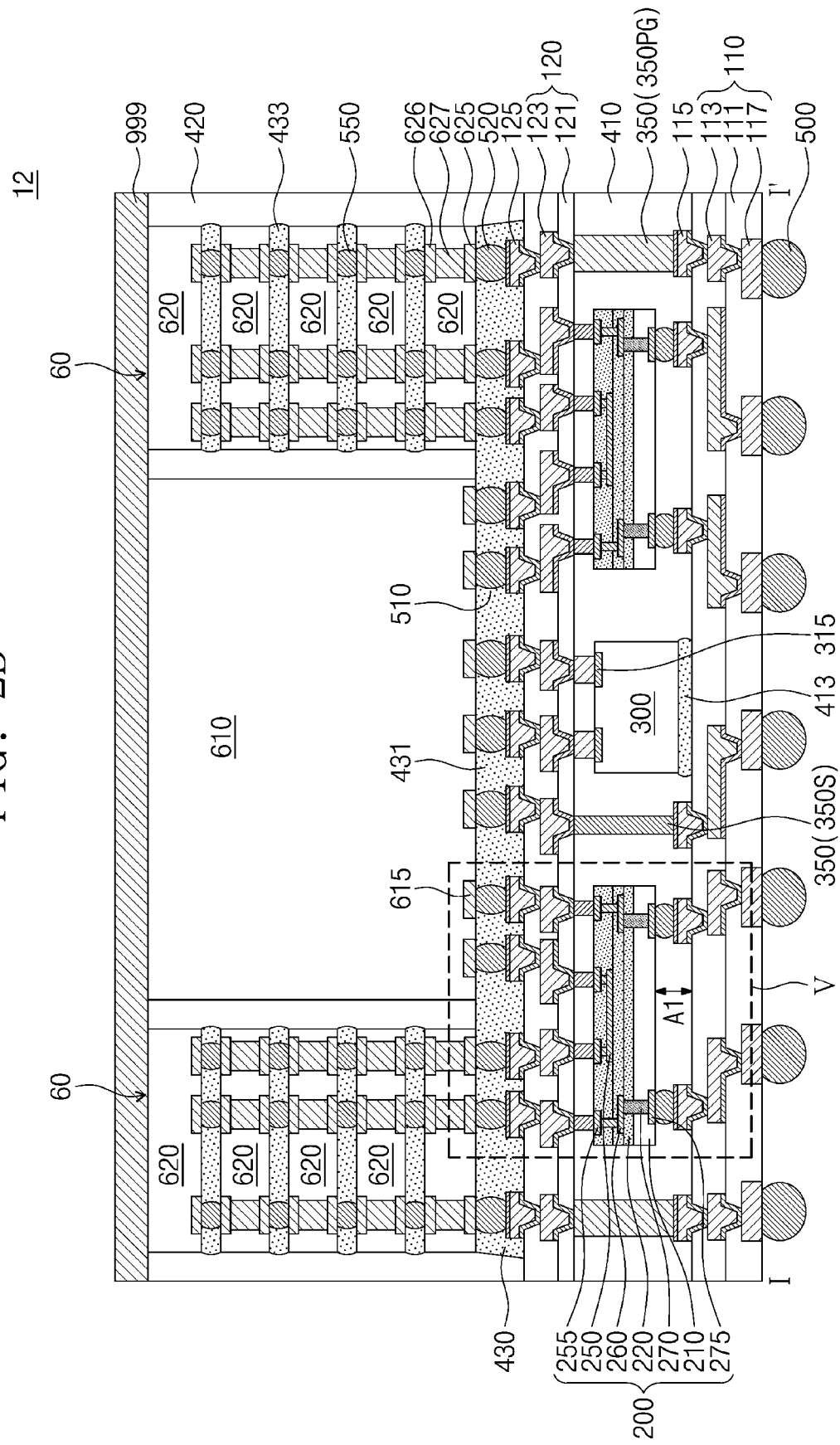
FIG. 2B is a sectional view taken along a line I-I' of FIG. 2A.
Figure 2C:
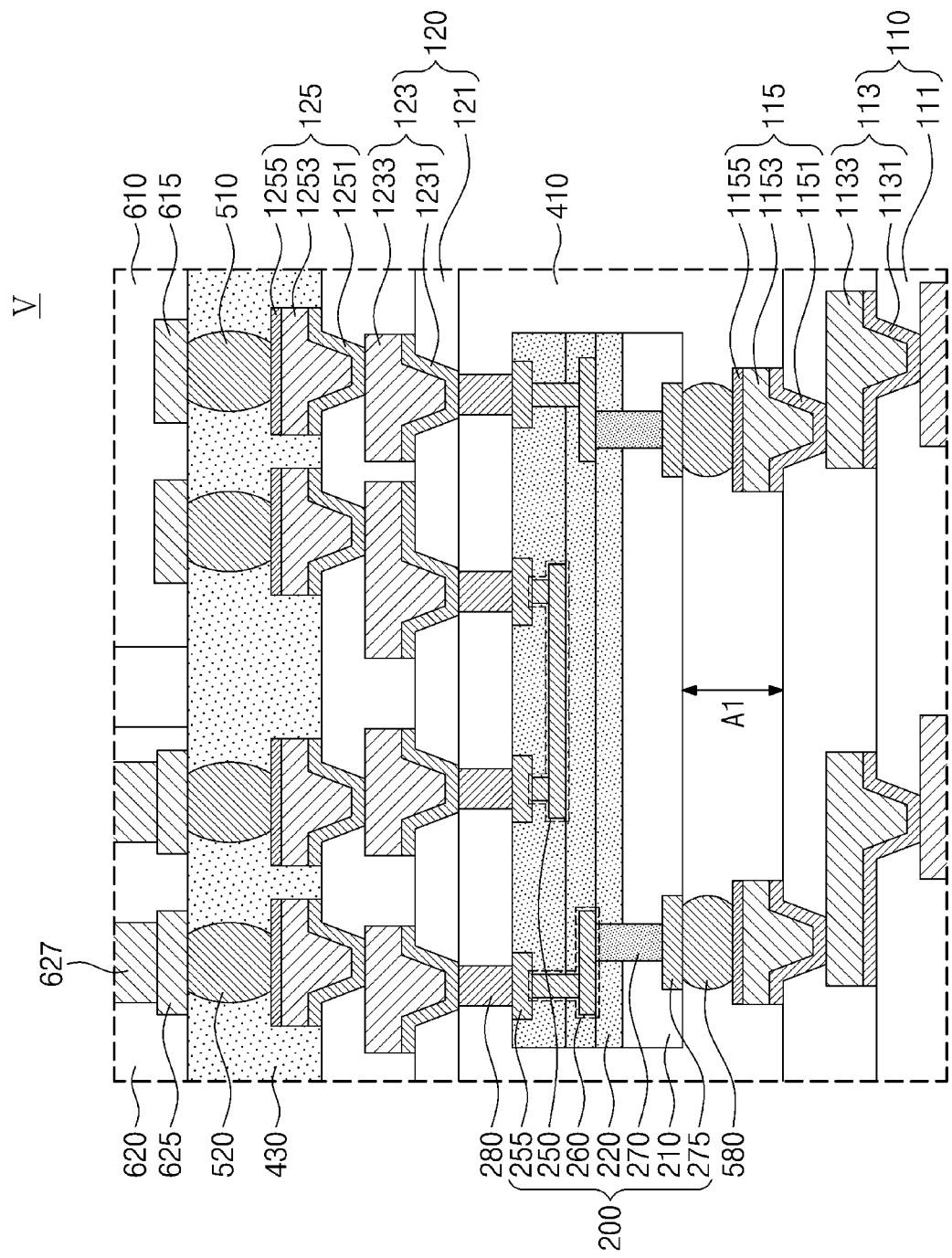
FIG. 2C is an enlarged sectional view of a portion V of FIG. 2B.
Figure 2D:
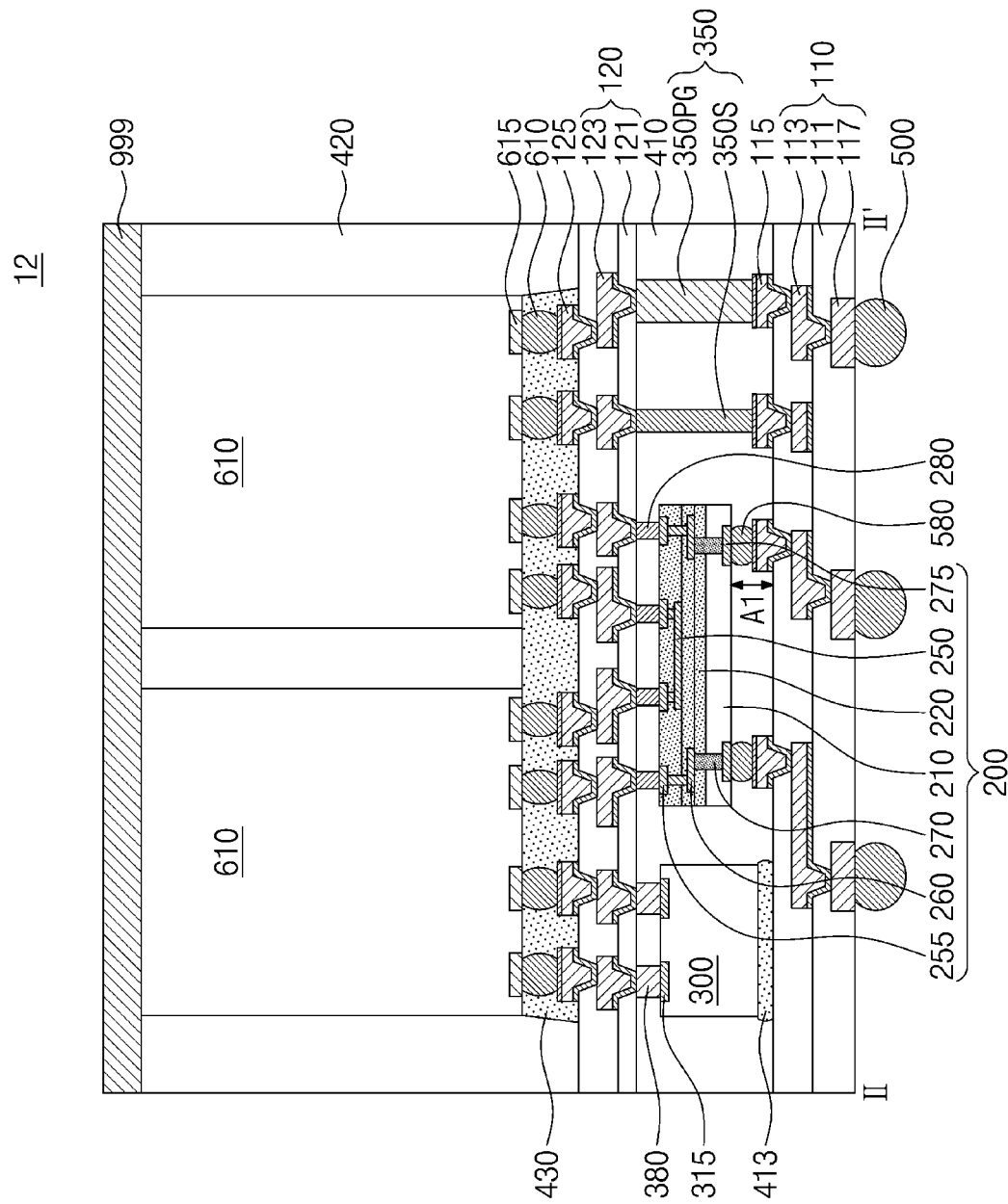
FIG. 2D is a sectional view taken along a line II-II' of FIG. 2A.

FIG. 2A is a plan view illustrating a semiconductor package according to an embodiment of the inventive concept. FIG. 2B is a sectional view taken along a line I-I' of FIG. 2A. FIG. 2C is an enlarged sectional view of a portion V of FIG. 2B. FIG. 2D is a sectional view taken along a line II-II' of FIG. 2A. For concise description, a previously described element may be identified by the same reference number without repeating an overlapping description thereof.

Referring to FIGS. 2A, 2B, 2C, and 2D, a semiconductor package 12 may include the solder terminals 500, the interposer structure, the first semiconductor chip 610, and the chip stacks 60. The interposer structure may include the first redistribution layer 110, the first redistribution pads 115, the second redistribution layer 120, the second redistribution pads 125, the bridge structures 200, the passive device 300, the second adhesive film 413, and the conductive structures 350. The interposer structure may have substantially the same structure as that described with reference to FIGS. 1A to 1E. However, the first adhesive film 411 of FIG. 1B may not be provided in the interposer structure in the present embodiment.

Each of the bridge structures 200 may further include metal patterns 260, penetration structures 270, and lower connection pads 275, in addition to the base substrate 210, the insulating patterns 220, the connection structure 250, and the connection pads 255, as shown in FIG. 2C. The lower connection pads 275 may be provided on the bottom surface of the base substrate 210. The lower connection pads 275 may be disposed on an edge region of the bottom surface of the base substrate 210. The lower connection pads 275 may be formed of or include at least one of metallic materials (e.g., copper, aluminum, gold, or nickel).

The penetration structures 270 may be provided in the base substrate 210. The penetration structures 270 may be disposed on and coupled to the lower connection pads 275. In an embodiment, the penetration structures 270 may be further extended into at least one of the insulating patterns 220. The penetration structures 270 may be formed of or include at least one of conductive materials (e.g., copper, titanium, tungsten, and/or alloys thereof).

The metal patterns 260 may be provided in or interposed between the insulating patterns 220. The metal patterns 260 may be connected to the connection pads 255 and the penetration structures 270, respectively. The metal patterns 260 may include a metal via and a metal line. The metal via may be provided to penetrate at least one of the insulating patterns 220. The metal line may be interposed between the insulating patterns 220. The connection structure 250 may be disposed between the metal patterns 260 and may be electrically disconnected from the metal patterns 260. Since the metal patterns 260 are provided, at least one of the penetration structures 270 may not be aligned in the second direction to the connection pad 255 that is electrically connected thereto. Accordingly, it may be possible to alleviate technical restrictions on the disposition of the lower connection pads 275 and the connection pads 255. As another example, the metal patterns 260 may be omitted, and the penetration structures 270 may be directly coupled to respective corresponding ones of the connection pads 255 and the lower connection pads 275.

First solder patterns 580 may be respectively interposed between corresponding pairs of the lower connection pads 275 of the bridge structure 200 and the first redistribution pads 115 disposed on the first redistribution layer 110. The lower connection pads 275 may be coupled to the first redistribution layer 110 through the first solder patterns 580. Accordingly, the first semiconductor chip 610 and the second semiconductor chips 620 may be electrically connected to the first redistribution layer 110 through the penetration structures 270. In other words, the penetration structures 270 may be used as electric conduction paths between the first semiconductor chip 610 and the first redistribution layer 110 or between the second semiconductor chip 620 and the first redistribution layer 110. The first solder patterns 580 may include solder balls. The first solder patterns 580 may be formed of or include at least one of soldering materials.

A first distance A1 between the first redistribution layer 110 and the bridge structure 200 may have a value selected from a range between 20 μm and 50 μm. The first distance A1 may be a distance between the top surface of the uppermost one of the first insulating layers 111 and the bottom surface of the base substrate 210. The first distance A1 may be larger than a thickness of the second adhesive film 413 in the second direction.

As shown in FIG. 2B, the height of the bridge structure 200 may be smaller than the height of the passive device 300. A height of a first passive device 301 may have a value selected from a range between 300 μm and 150 μm. The height of the bridge structure 200 may have a value selected from a range between 30 μm and 150 μm but may be smaller than the height of the passive device 300.

The bridge structures 200 may have substantially the same size as each other. For example, the bridge structures 200 may have the same width.

The semiconductor package 12 may include an under-fill layer 430. The under-fill layer 430 may be provided in the first gap region between the second redistribution layer 120 and the first semiconductor chip 610 and may be extended into the second gap regions between the second redistribution layer 120 and the chip stacks 60. For example, the under-fill layer 430 may be provided to seal or encapsulate the first bonding bumps 510 and the second bonding bumps 520. The under-fill layer 430 may be formed of or include an insulating polymer (e.g., epoxy-based polymers).

The upper mold layer 420 may cover the side surface of the first semiconductor chip 610 and the side surfaces of the second semiconductor chips 620. Although not illustrated, the upper mold layer 420 may be extended to cover the top surface of the first semiconductor chip 610 and the top surface of the uppermost one of the second semiconductor chips 620.

The semiconductor package 12 may further include a heat-dissipation structure 999. The heat-dissipation structure 999 may be disposed on the top surface of the first semiconductor chip 610, the top surfaces of the chip stacks 60, and the top surface of the upper mold layer 420. Although not illustrated, the heat-dissipation structure 999 may be extended to a region on the side surface of the upper mold layer 420. The heat-dissipation structure 999 may be formed of or include a material having high thermal conductivity, and in this case, the heat-dissipation structure 999 may be used as a heat sink, a heat slug, or a heat spreader. For example, heat, which is produced from the first or second semiconductor chips 610 or 620 during operations of the semiconductor package 12, may be quickly dissipated to the outside through the heat-dissipation structure 999. The heat-dissipation structure 999 may be formed of or include at least one of metallic materials (e.g., copper). In addition, the heat-dissipation structure 999 may be configured to absorb physical impact from the outside and thereby to protect the first semiconductor chip 610 and the chip stacks 60 from the physical impact.

The heat-dissipation structure 999 may have an electrically conductive property, and in this case, the heat-dissipation structure 999 may also be used as an electromagnetic wave shielding layer. For example, the heat-dissipation structure 999 may be used to prevent an electromagnetic interference (EMI) issue from occurring between the first semiconductor chip 610 and the second semiconductor chips 620. In this case, the heat-dissipation structure 999 may be grounded through the second redistribution layer 120 to prevent the first or second semiconductor chips 610 or 620 from being electrically damaged by an electrostatic discharge (ESD) phenomenon.

Figure 3A:
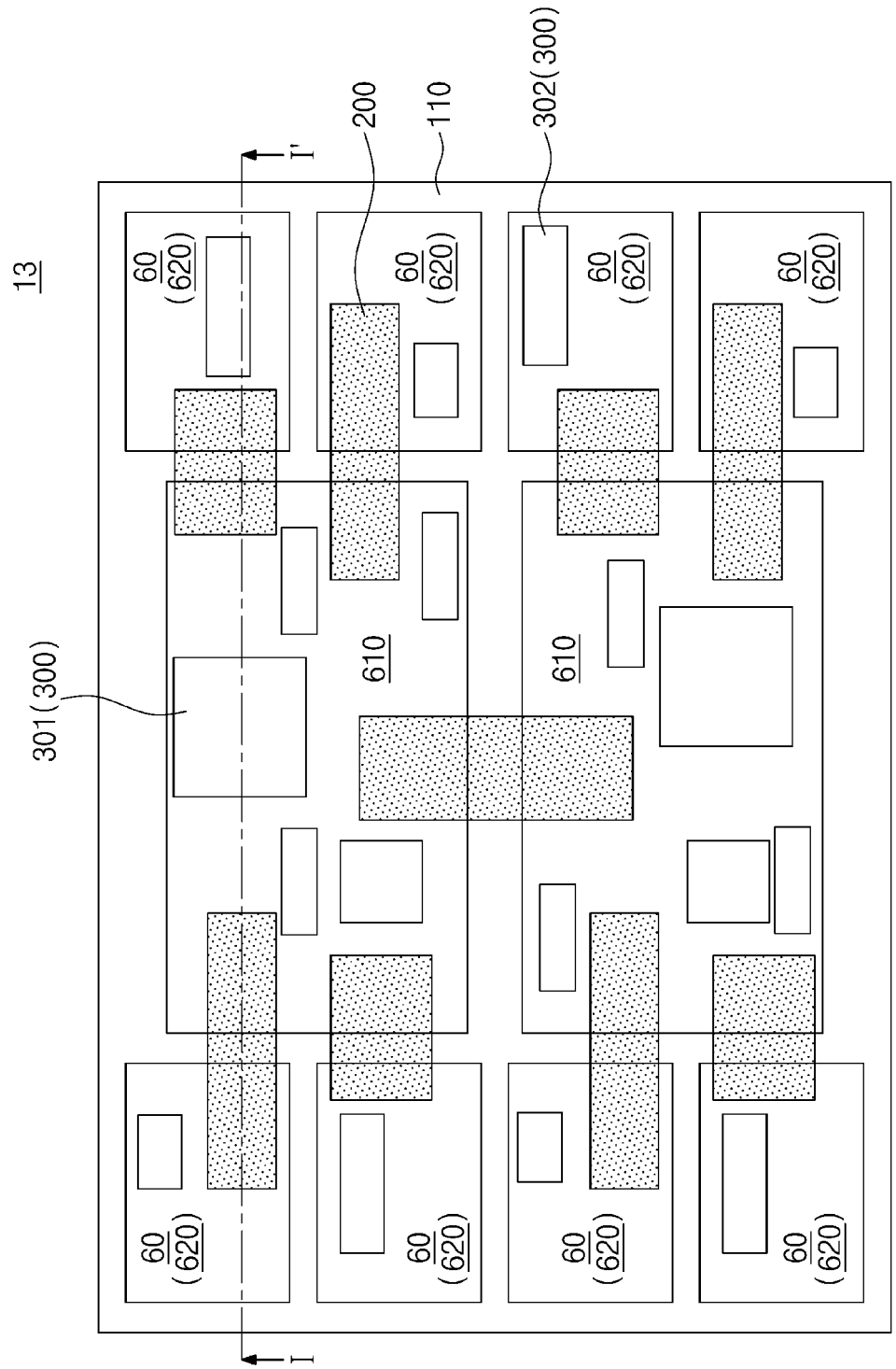
FIG. 3A is a plan view illustrating a semiconductor package according to an embodiment of the inventive concept.
Figure 3B:
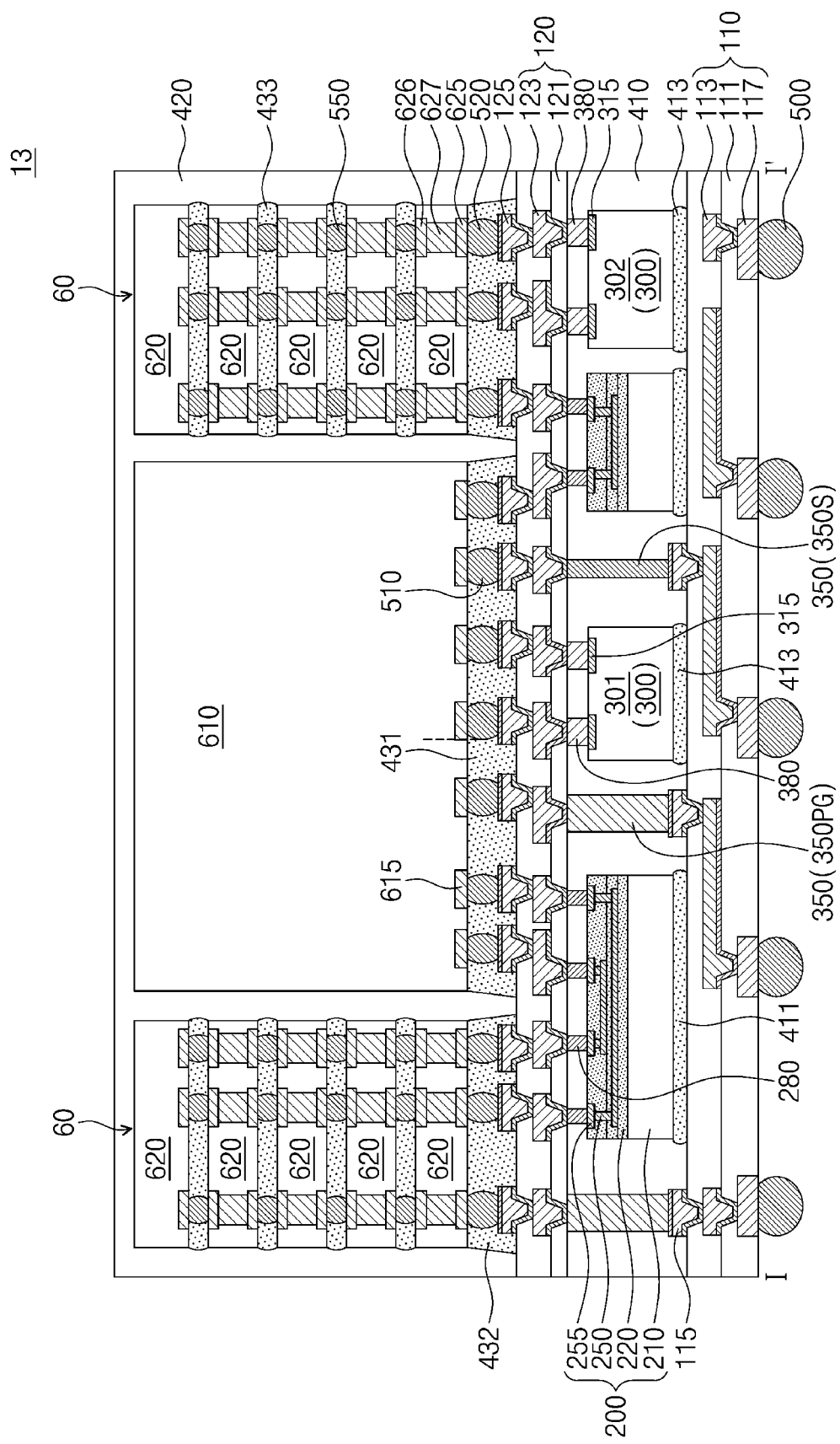
FIG. 3B is a sectional view taken along a line I-I' of FIG. 3A.

FIG. 3A is a plan view illustrating a semiconductor package according to an embodiment of the inventive concept. FIG. 3B is a sectional view taken along a line I-I' of FIG. 3A.

Referring to FIGS. 3A and 3B, a semiconductor package 13 may include the interposer structure, the solder terminals 500, the first semiconductor chip 610, and the chip stacks 60. The interposer structure may include the first redistribution layer 110, the first redistribution pads 115, the second redistribution layer 120, the second redistribution pads 125, the bridge structures 200, the passive devices 300, and the conductive structures 350.

The passive devices 300 may include first passive devices 301 and second passive devices 302. The first passive devices 301 may be overlapped in the second direction with the first semiconductor chips 610, when viewed in a plan view. The first passive devices 301 may be coupled to the first semiconductor chips 610. The second passive devices 302 may be overlapped in the second direction with the chip stack 60, when viewed in a plan view. For example, the second passive devices 302 may be vertically overlapped in the second direction with the second semiconductor chips 620. The second passive devices 302 may be electrically coupled to the second semiconductor chips 620, but the inventive concept is not limited to this example. The number of first passive devices 301 may be more than the number of second passive devices 302. Since each of the first semiconductor chips 610 is electrically connected to a large number of the first passive devices 301, the operation of the first semiconductor chip 610 may be performed in a reliable manner. Accordingly, the electric characteristics of the semiconductor package 13 may be improved.

Figure 4A:
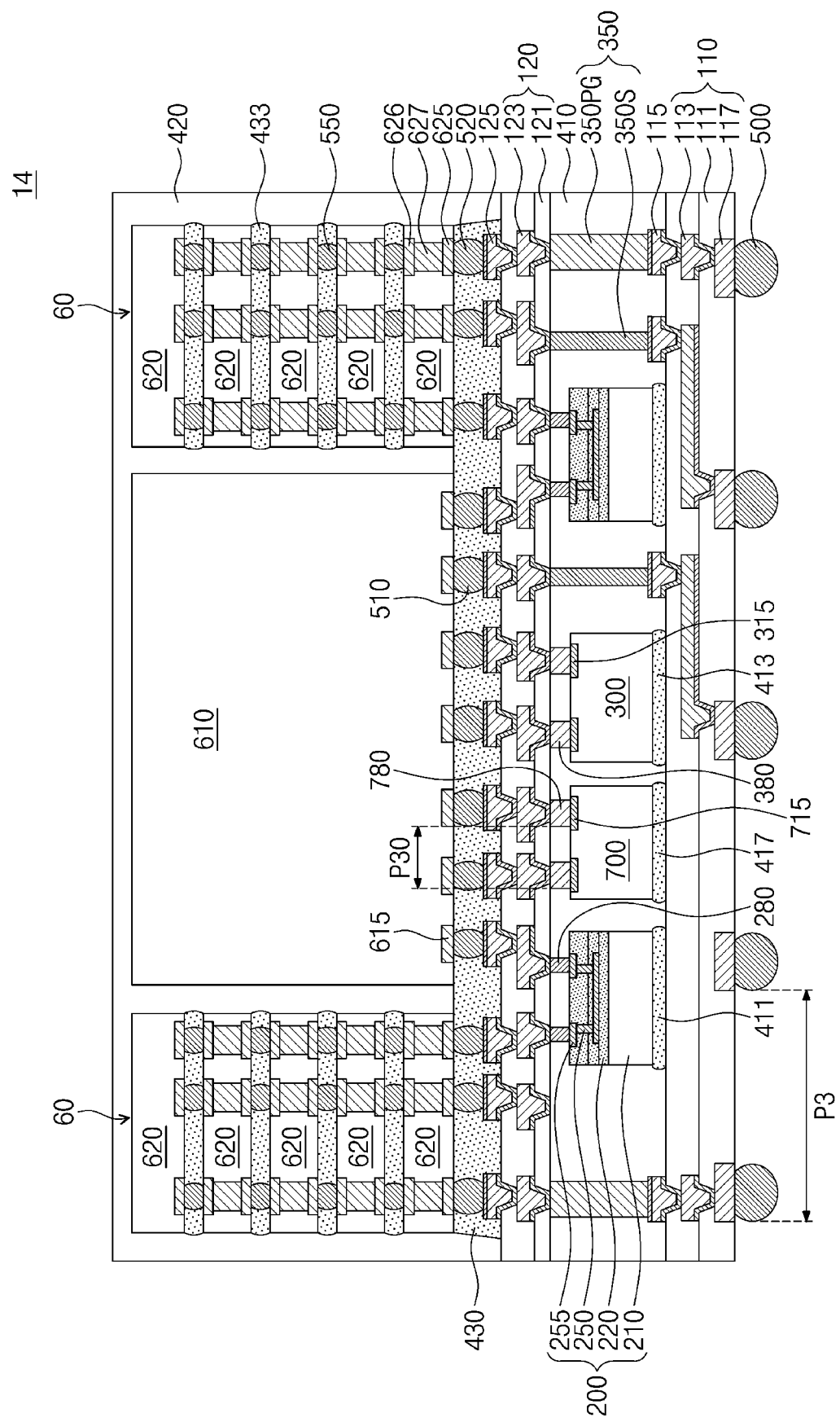
FIG. 4A is a sectional view illustrating a semiconductor package according to an embodiment of the inventive concept.

FIG. 4A is a sectional view illustrating a semiconductor package according to an embodiment of the inventive concept.

Referring to FIG. 4A, a semiconductor package 14 may include the interposer structure, the solder terminals 500, the first semiconductor chip 610, and the chip stacks 60. The interposer structure may include the first redistribution layer 110, the first redistribution pads 115, the second redistribution layer 120, the second redistribution pads 125, the bridge structures 200, at least one passive device 300, the conductive structures 350, and an electronic device 700.

The electronic device 700 may be disposed on the top surface of the first redistribution layer 110 and may be laterally spaced apart from the bridge structures 200 and the passive device 300. The electronic device 700 may be an active device. For example, the electronic device 700 may be a semiconductor chip. As an example, the electronic device 700 may be an input/output chip (I/O chip) or a power management chip. The power management chip may include a power management integrated circuit (PMIC). As another example, the electronic device 700 may be a chiplet. The chiplet may include a plurality of IP blocks, which are configured to realize different functions. Each of the IP blocks may include integrated circuits. The electronic device 700 may have conductive pads 715. The conductive pads 715 may be provided on a top surface of the electronic device 700. The conductive pads 715 may be formed of or include at least one of metallic materials (e.g., copper, nickel, gold, and/or aluminum).

The semiconductor package 14 may include third pillar patterns 780. The third pillar patterns 780 may be provided between the electronic device 700 and the second redistribution layer 120. The third pillar patterns 780 may be disposed on the conductive pads 715, respectively and may be coupled to integrated circuits in the electronic device 700. The third pillar patterns 780 may be coupled to the bottom surfaces of the second redistribution patterns 123, respectively. The third pillar patterns 780 may be formed of or include at least one of metallic materials (e.g., copper, titanium, and/or alloys thereof). A pitch P30 of the third pillar patterns 780 may be smaller than the pitch P3 of the solder terminals 500.

The semiconductor package 14 may include a third adhesive film 417. The third adhesive film 417 may be interposed between the electronic device 700 and the bridge structure 200. The electronic device 700 may be attached to the first redistribution layer 110 using the third adhesive film 417. The third adhesive film 417 may have an insulating property. The third adhesive film 417 may include a die attach film. A thickness of the third adhesive film 417 may have a value selected from a range between 3 μm and 25 μm. The thickness of the third adhesive film 417 may be smaller than a height of the electronic device 700. The height of the electronic device 700 may have a value selected from a range between 30 μm and 150 μm.

Figure 4B:
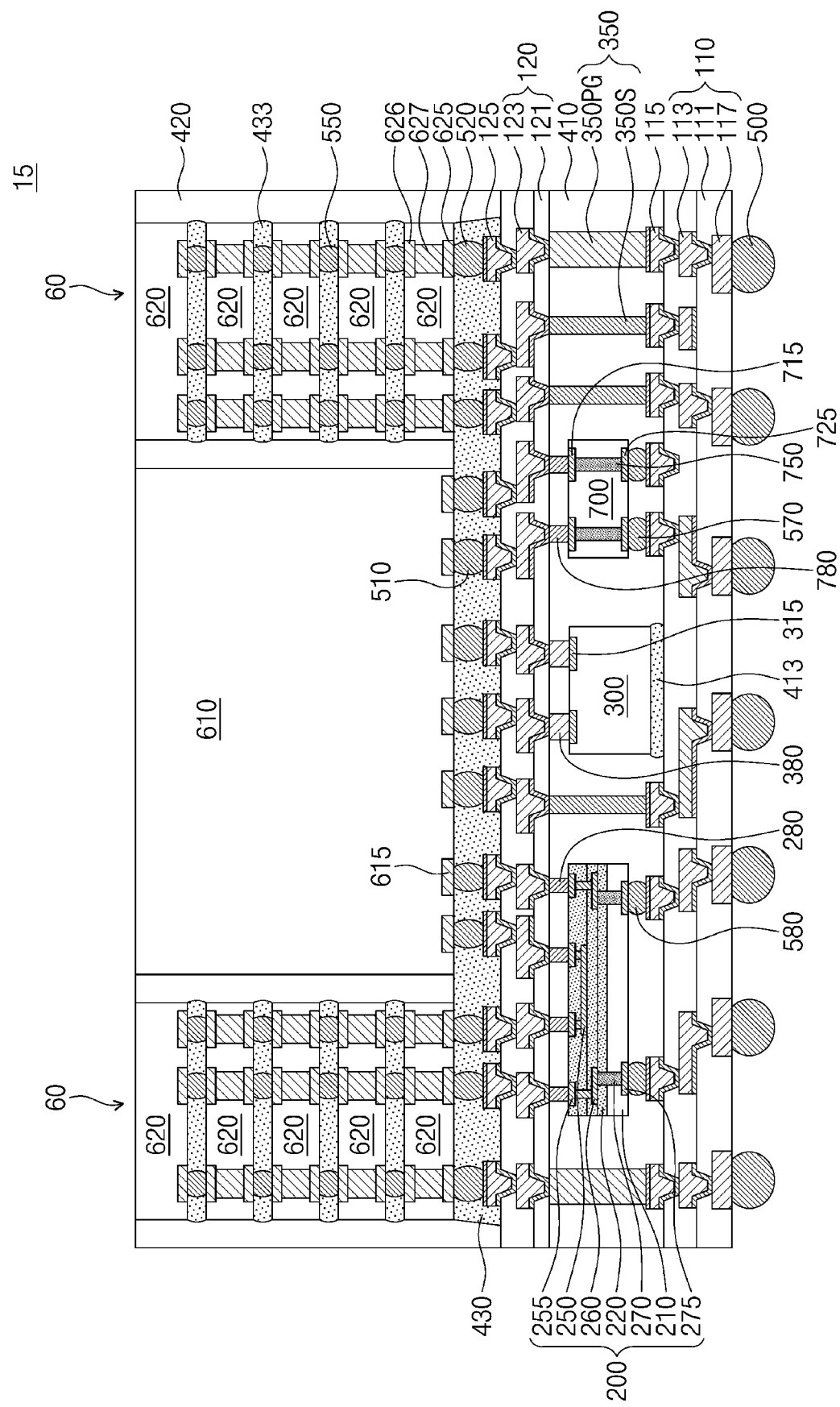
FIG. 4B is a sectional view illustrating a semiconductor package according to an embodiment of the inventive concept.

FIG. 4B is a sectional view illustrating a semiconductor package according to an embodiment of the inventive concept.

Referring to FIG. 4B, a semiconductor package 15 may include the interposer structure, the solder terminals 500, the first semiconductor chip 610, and the chip stack 60. The interposer structure may include the first redistribution layer 110, the first redistribution pads 115, the second redistribution layer 120, the second redistribution pads 125, the bridge structures 200, the passive device 300, the conductive structures 350, the first to third pillar patterns 280, 380, and 780, the first solder patterns 580, and the electronic device 700. The semiconductor package 15 may not include the third adhesive film 417 described with reference to FIG. 4A.

The electronic device 700 may include the conductive pads 715, penetration vias 750, and lower conductive pads 725. The conductive pads 715 may be provided on a top surface of the electronic device 700 and may be coupled to the second redistribution layer 120 through the third pillar patterns 780. The lower conductive pads 725 may be provided on a bottom surface of the electronic device 700. The lower conductive pads 725 may be formed of or include at least one of metallic materials (e.g., copper, nickel, gold, and/or aluminum). The penetration vias 750 may be provided in the electronic device 700 to penetrate at least a portion of the electronic device 700. The penetration vias 750 may be coupled to the conductive pads 715 and the lower conductive pads 725, respectively. The penetration vias 750 may be electrically connected to integrated circuits (not shown) of the electronic device 700. The penetration vias 750 may be formed of or include at least one of conductive materials (e.g., copper, titanium, tungsten, and/or alloys thereof).

The semiconductor package 15 may include second solder patterns 570. Each of the second solder patterns 570 may be interposed between a corresponding pair of the lower conductive pads 725 and the first redistribution pads 115. The lower conductive pads 725 may be coupled to the first redistribution layer 110 through the second solder patterns 570. The electronic device 700 may be electrically connected to the first redistribution pattern 113 through the second solder patterns 570. The first or second semiconductor chips 610 or 620 may be electrically connected to the first redistribution pattern 113 through the second redistribution layer 120 and the penetration structures 270. The second solder patterns 570 may include solder balls. The second solder patterns 570 may be formed of or include at least one of solder materials.

The afore-described embodiments may be combined to realize the inventive concept. For example, at least two of the embodiments for the semiconductor package 11 of FIGS. 1A to 1E, the semiconductor package 12 of FIGS. 2A to 2D, the semiconductor package 13 of FIGS. 3A and 3B, the semiconductor package 14 of FIG. 4A, and the semiconductor package 15 of FIG. 4B may be realized in a combined or mixed manner.

Figure 4C:
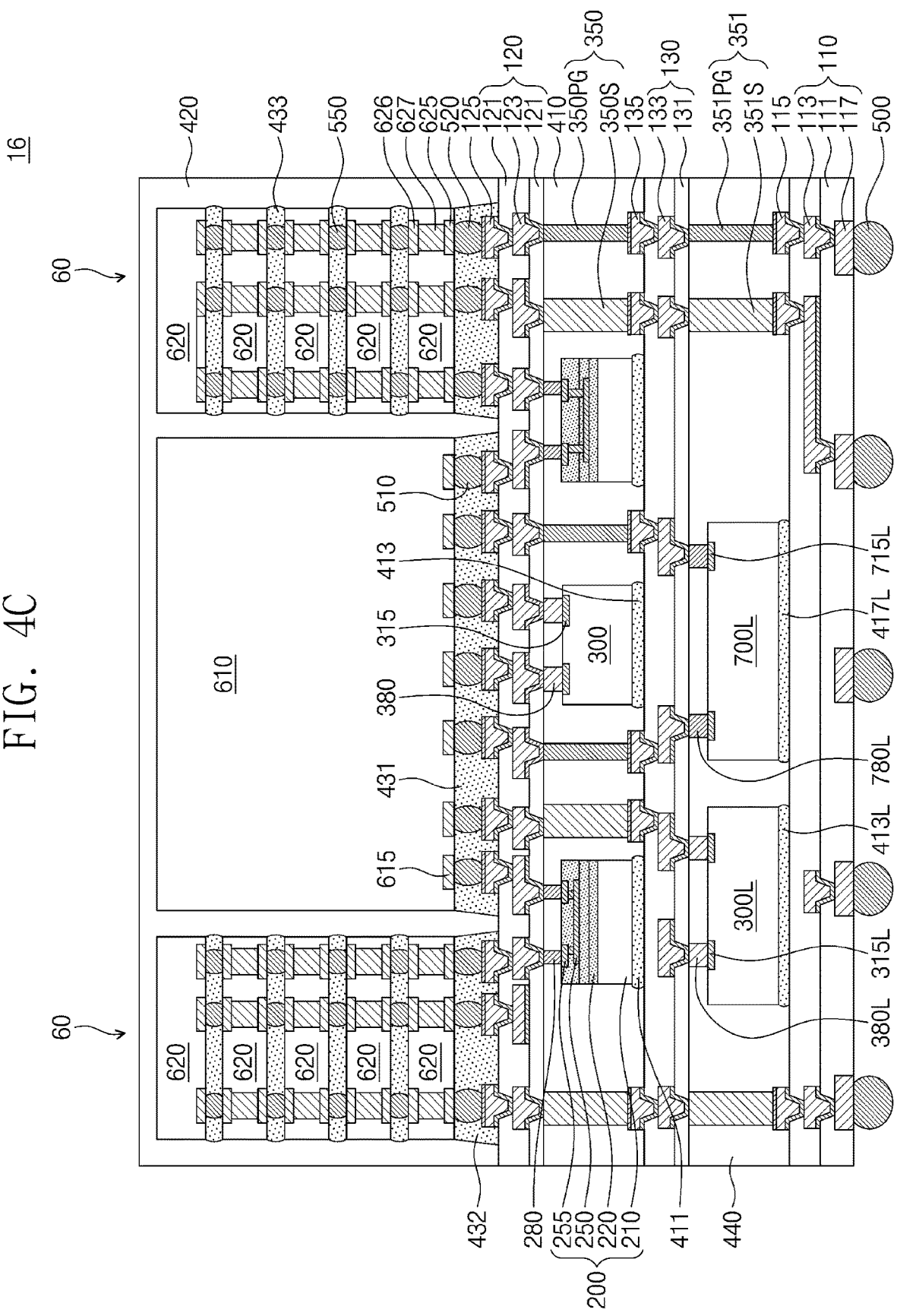
FIG. 4C is a sectional view illustrating a semiconductor package according to an embodiment of the inventive concept.

FIG. 4C is a sectional view illustrating a semiconductor package according to an embodiment of the inventive concept. For concise description, a previously described element may be identified by the same reference number without repeating an overlapping description thereof.

Referring to FIG. 4C, a semiconductor package 16 may include the interposer structure, the solder terminals 500, the first semiconductor chip 610, and the chip stack 60. The interposer structure may include the first redistribution layer 110, the first redistribution pads 115, the second redistribution layer 120, the second redistribution pads 125, the bridge structures 200, the passive device 300, the conductive structures 350, first and second pillar patterns 280, 380, the lower mold layer 410, a third redistribution layer 130, lower conductive structures 351, the lower passive device 300L, a lower electronic device 700L, and a molding pattern 440.

The lower passive device 300L may be disposed on the top surface of the first redistribution layer 110. The lower passive device 300L may include the lower terminals 315L, which are provided on a top surface thereof.

The lower electronic device 700L may be disposed on the top surface of the first redistribution layer 110 and may be laterally spaced apart from the lower passive device 300L. The lower electronic device 700L may include an active device, a semiconductor chip, or a chiplet. For example, the electronic device 700 may be an input/output (I/O) chip or a power management chip. The lower electronic device 700L may have lower pads 715L, which are provided on a top surface thereof. The lower pads 715L may be formed of or include at least one of metallic materials.

The interposer structure may further include at least one of a first lower adhesive film 413L and a second lower adhesive film 417L. The first lower adhesive film 413L may be interposed between the first redistribution layer 110 and the lower passive device 300L. The lower passive device 300L may be fastened to the first redistribution layer 110 by the first lower adhesive film 413L. The second lower adhesive film 417L may be interposed between the first redistribution layer 110 the lower electronic device 700L. The first lower adhesive film 413L and the second lower adhesive film 417L may have an insulating property and may include die attach films.

The molding pattern 440 may be disposed on the first redistribution layer 110 to cover the lower passive device 300L and the lower electronic device 700L. The molding pattern 440 may be formed of or include at least one of epoxy-based insulating materials.

The third redistribution layer 130 may be disposed on the molding pattern 440. The third redistribution layer 130 may be interposed between the first redistribution layer 110 and the second redistribution layer 120. The third redistribution layer 130 may include third insulating layers 131 and third redistribution patterns 133. The third insulating layers 131 may be vertically stacked on top of another. Adjacent ones of the third insulating layers 131 may be provided to have no observable interface therebetween. The third insulating layers 131 may be formed of or include at least one of organic materials (e.g., photosensitive polymers).

The third redistribution patterns 133 may be provided in the third insulating layers 131 or on the third insulating layers 131. Each of the third redistribution patterns 133 may include a third seed pattern and a third conductive pattern. The third conductive pattern and the third seed pattern may be configured to have substantially the same features as the first conductive pattern 1133 and the first seed pattern 1131, respectively, which were previously described with reference to FIGS. 1B and 1C. The expression "an element is electrically connected to the third redistribution layer 130" may mean that the element is electrically connected to at least one of the third redistribution patterns 133.

The interposer structure may further include third redistribution pads 135. The third redistribution pads 135 may be interposed between the third redistribution layer 130 and the conductive structures 350. The conductive structures 350 may be coupled to the third redistribution patterns 133 through the third redistribution pads 135.

The bridge structure 200 and the passive device 300 may be disposed on the third redistribution layer 130. The first adhesive film 411 may be interposed between the third redistribution layer 130 and the bridge structure 200. The second adhesive film 413 may be interposed between the third redistribution layer 130 and the passive device 300.

The lower conductive structures 351 may be interposed between the first redistribution layer 110 and the third redistribution layer 130 and may be coupled to the first redistribution layer 110 and the third redistribution layer 130. The lower conductive structures 351 may be laterally spaced apart from the lower passive device 300L and lower electronic devices 700L. The lower conductive structures 351 may be disposed on and coupled to the first redistribution pads 115, respectively. Top surfaces of the lower conductive structures 351 may be coupled to the third redistribution patterns 133, respectively.

The lower conductive structures 351 may include the first lower conductive structures 351S and second lower conductive structures 351PG. The first lower conductive structures 351S may be signal structures.

The second lower conductive structures 351PG may be spaced apart from and disconnected from the first lower conductive structures 351S. The second lower conductive structures 351PG may include at least one of the ground/power structure and the SerDes structure. A width of the second lower conductive structures 351PG in the first direction may be larger than a width of the first lower conductive structures 351S in the first direction. For example, the width of the second lower conductive structures 351PG may be 120% to 300% of the width of the first lower conductive structures 351S.

The interposer structure may further include first lower pillar patterns 380L. The first lower pillar patterns 380L may be provided between the lower passive device 300L and the second redistribution layer 120. The first lower pillar patterns 380L may be respectively disposed on the lower terminals 315L to be coupled to the lower passive device 300L. The first lower pillar patterns 380L may be coupled to bottom surfaces of the third redistribution patterns 133, respectively. A pitch of the first lower pillar patterns 380L may be smaller than a pitch of the solder terminals 500.

The first semiconductor chip 610 may be electrically connected to the lower passive device 300L through the second redistribution layer 120, the second conductive structures 350PG, and the third redistribution layer 130.

The interposer structure may further include second lower pillar patterns 780L. The second lower pillar patterns 780L may be provided between the lower electronic device 700L and the third redistribution layer 130. The second lower pillar patterns 780L may be coupled to the lower pads 715L and the third redistribution patterns 133. The second lower pillar patterns 780L may be formed of or include at least one of metallic materials. A pitch of the second lower pillar patterns 780L may be smaller than the pitch of the solder terminals 500.

The first semiconductor chip 610 may be electrically connected to the lower electronic device 700L through the second redistribution layer 120, the first conductive structures 350S, and the third redistribution layer 130.

In an embodiment, although not illustrated, at least one of the lower passive device 300L and the lower electronic device 700L may be omitted.

FIGS. 5A to 5H are sectional views, which are taken along the line I-I' of FIG. 1A to illustrate a method of fabricating a semiconductor package according to an embodiment of the inventive concept.

Figure 5A:
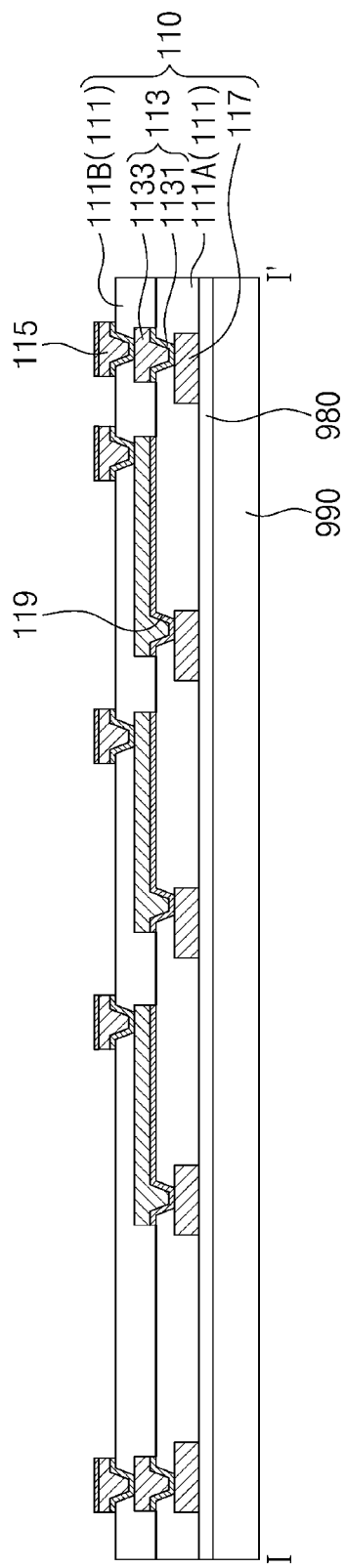

Referring to FIG. 5A, the first redistribution layer 110 may be formed on a first carrier substrate 990. In addition, a carrier adhesive layer 980 may be interposed between the first carrier substrate 990 and the first redistribution layer 110. The carrier adhesive layer 980 may attach the first redistribution layer 110 to the first carrier substrate 990. The carrier adhesive layer 980 may be a release layer. The formation of the first redistribution layer 110 may be performed in a wafer- or panel-level.

The formation of the first redistribution pattern 113 may include forming the under-bump patterns 117, forming the first lower insulating layer 111A on the under-bump patterns 117, forming an opening 119 in the first lower insulating layer 111A, forming a seed layer in the opening 119 and the top surface of the first lower insulating layer 111A, forming a resist pattern having a guide opening on the seed layer, performing an electroplating process using a seed layer as an electrode, removing the resist pattern to expose a portion of the seed layer, etching the exposed portion of the seed layer, and forming the first upper insulating layer 111B.

The opening 119 may be formed to expose a corresponding one of the under-bump patterns 117. The guide opening may be connected to the opening 119. As a result of the electroplating process, the first conductive pattern 1133 may be formed in the opening 119. The first conductive pattern 1133 may be formed to fill a lower portion of the guide opening. As a result of the etching of the seed layer, the first seed pattern 1131 may be formed. Accordingly, the first redistribution layer 110 including the first insulating layer 111, the under-bump patterns 117, and the first redistribution patterns 113 may be formed. The first insulating layer 111 may include the first lower insulating layer 111A and the first upper insulating layer 111B. Each of the first redistribution patterns 113 may include the first seed pattern 1131 and the first conductive pattern 1133. The first upper insulating layer 111B may cover the first redistribution patterns 113, on the first lower insulating layer 111A.

The first redistribution pads 115 may be formed on and coupled to the first redistribution patterns 113, respectively.

Figure 5B:
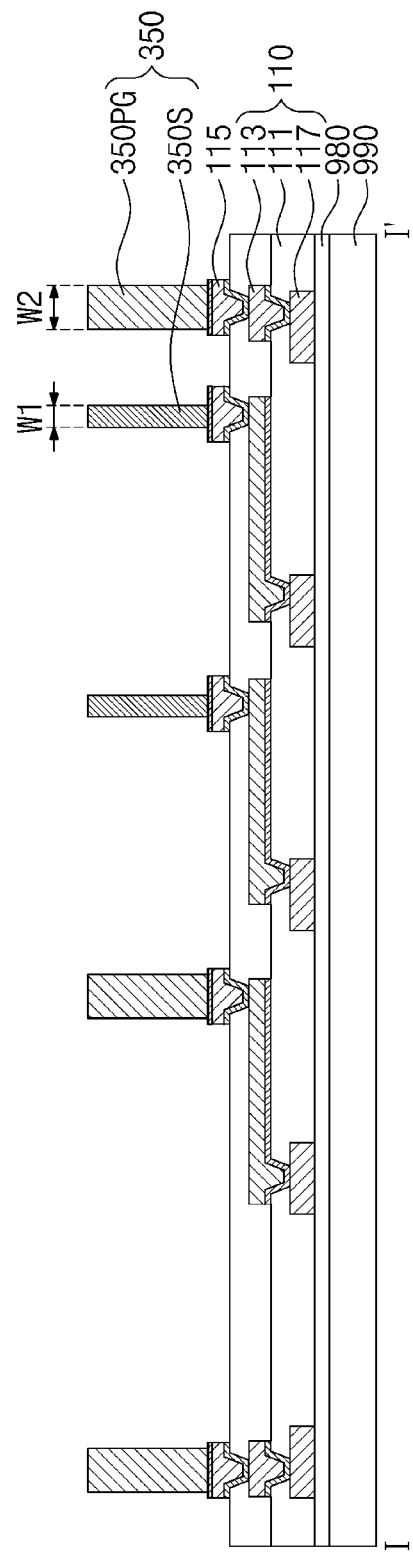

Referring to FIG. 5B, the conductive structures 350 may be formed on and coupled to the first redistribution pads 115, respectively. The conductive structures 350 may include the first conductive structures 350S and the second conductive structures 350PG. The width W1 of the first conductive structures 350S may be smaller than the width W2 of the second conductive structures 350PG.

Referring to FIG. 5C, the bridge structures 200 and the passive device 300 may be disposed on the first redistribution layer 110. The disposing of the bridge structures 200 may include attaching the bridge structures 200 to the first redistribution layer 110 using a plurality of first adhesive films 411. The disposing of the passive device 300 may include attaching the passive device 300 to the first redistribution layer 110 using the second adhesive film 413.

The first pillar patterns 280 may be formed on the connection pads 255 of the bridge structures 200, respectively. The formation of the first pillar patterns 280 may be performed before or after disposing the bridge structures 200 on the first redistribution layer 110.

The second pillar patterns 380 may be formed on the terminals 315 of the passive device 300, respectively. The formation of the second pillar patterns 380 may be performed before or after disposing the passive device 300 on the first redistribution layer 110.

Referring to FIG. 5D, a preliminary mold layer 410P may be formed on the top surface of the first redistribution layer 110 to cover the conductive structures 350, the bridge structures 200, the passive device 300, the first pillar patterns 280, and the second pillar patterns 380. For example, a top surface of the preliminary mold layer 410P may be located at a level that is higher than the top surfaces of the conductive structures 350, the first pillar patterns 280, and the second pillar patterns 380.

Figure 5E:
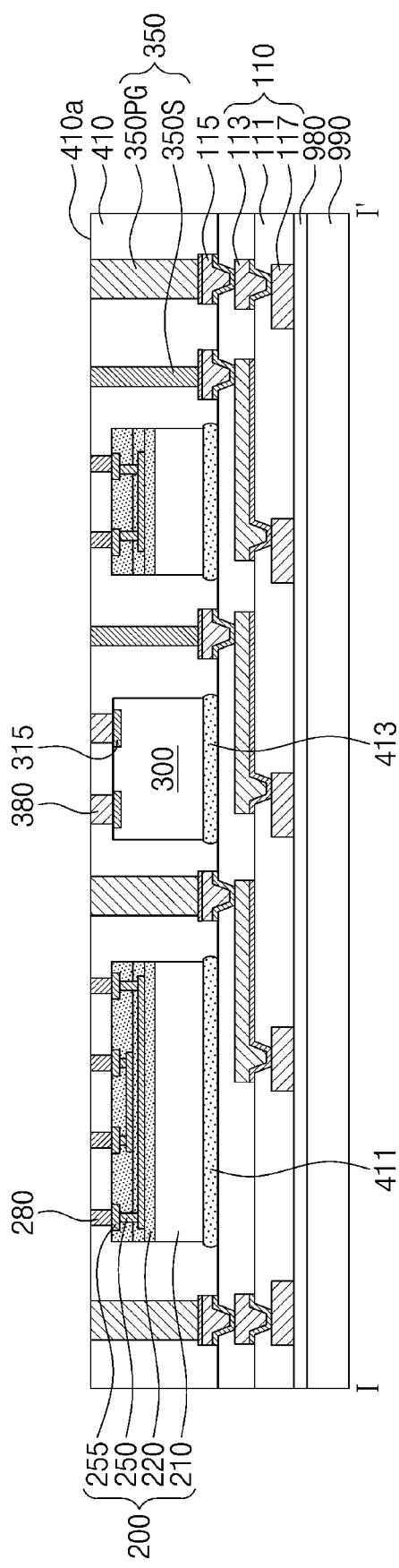

Referring to FIG. 5E, a thinning process may be performed on the preliminary mold layer 410P to form the lower mold layer 410. The thinning process may be performed using a chemical mechanical polishing (CMP) technology. The thinning process may be performed until the conductive structures 350, the first pillar patterns 280, and the second pillar patterns 380 are exposed to the outside. The conductive structures 350, the first pillar patterns 280, and the second pillar patterns 380 may be additionally polished during the thinning process. As a result of the thinning process, a top surface 410a of the lower mold layer 410 may be formed at substantially the same level as the top surfaces of the conductive structures 350, the top surfaces of the first pillar patterns 280, and the top surfaces of the second pillar patterns 380.

Figure 5F:
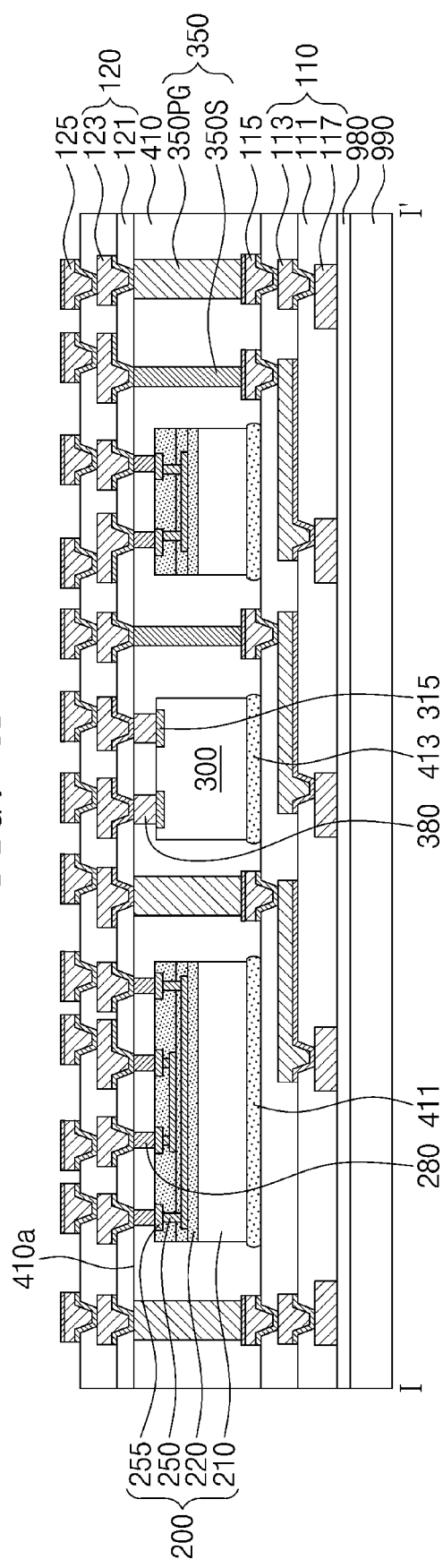

Referring to FIG. 5F, the second redistribution layer 120 may be formed on the top surface 410a of the lower mold layer 410. The formation of the second redistribution layer 120 may include forming the second insulating layers 121 and forming the second redistribution patterns 123. The second insulating layers 121 and the second redistribution patterns 123 may be substantially the same as those in the previous embodiment of FIG. 1D. According to an embodiment of the inventive concept, since the top surface 410a of the lower mold layer 410 is located at substantially the same level as the top surfaces of the conductive structures 350, the first pillar patterns 280, and the second pillar patterns 380, the second redistribution layer 120 may be formed in a desired shape. For example, it may be possible to prevent the second redistribution patterns 123 from being formed in an undulating shape.

The second redistribution pads 125 may be formed on and coupled to the second redistribution patterns 123, respectively.

Figure 5G:
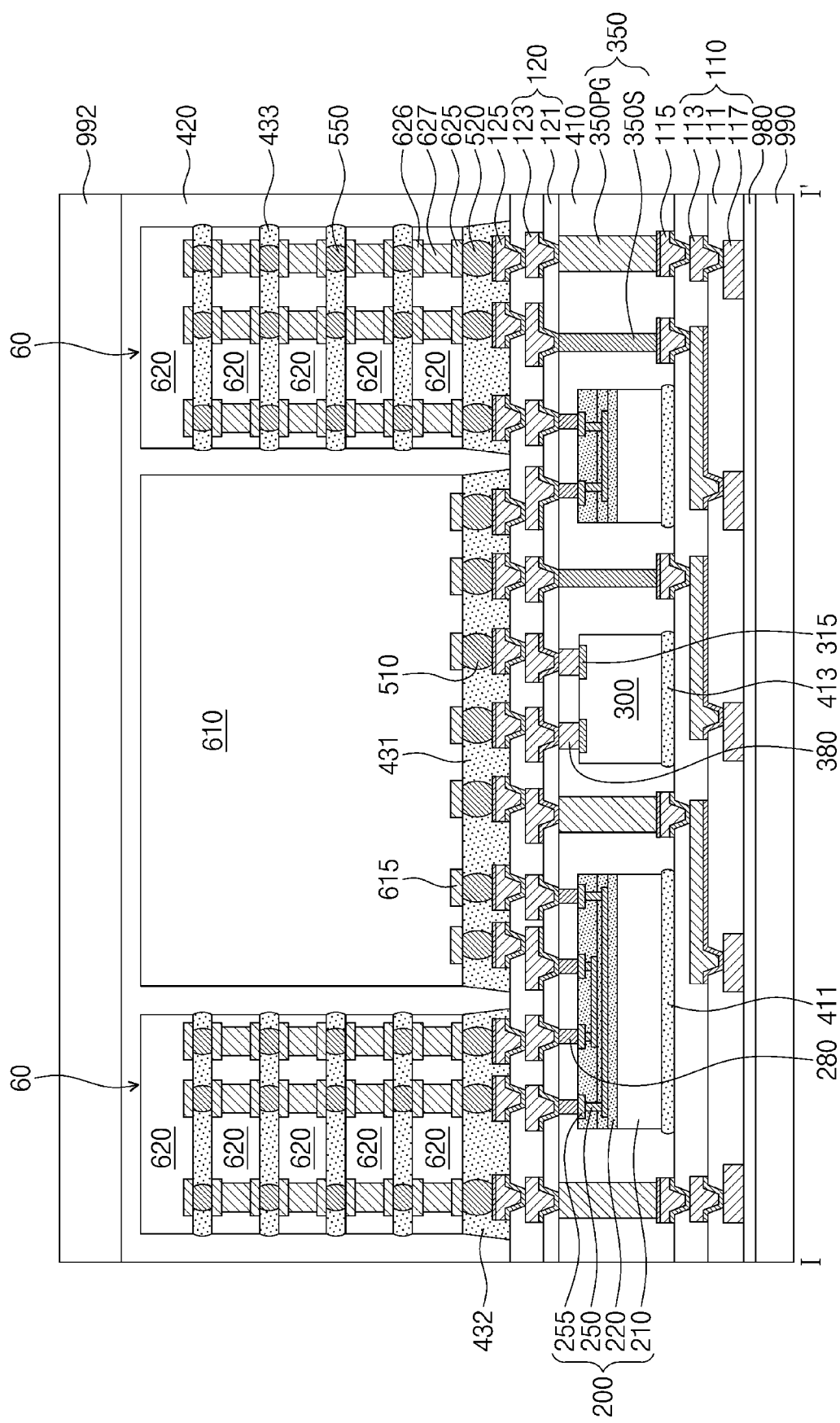

Referring to FIG. 5G, the first semiconductor chip 610 and the chip stacks 60 may be mounted on the second redistribution layer 120. The mounting of the first semiconductor chip 610 may include forming the first bonding bumps 510 between the chip pads 615 of the first semiconductor chip 610 and the corresponding second redistribution pads 125. Each of the chip stacks 60 may include the second semiconductor chips 620, the interposer bumps 550, and the upper under-fill layers 433, which are stacked. The mounting of the chip stacks 60 may include forming the second bonding bumps 520 between the lower pads 625 of the lowermost one of the second semiconductor chips 620 and the corresponding second redistribution pads 125.

The first under-fill layer 431 may be formed between the second redistribution layer 120 and the first semiconductor chip 610. The second under-fill layers 432 may be respectively formed between the second redistribution layer 120 and the chip stacks 60. The upper mold layer 420 may be formed on the second redistribution layer 120 to cover the first semiconductor chip 610 and the second semiconductor chips 620. A second carrier substrate 992 may be attached to the top surface of the upper mold layer 420.

Figure 5H:
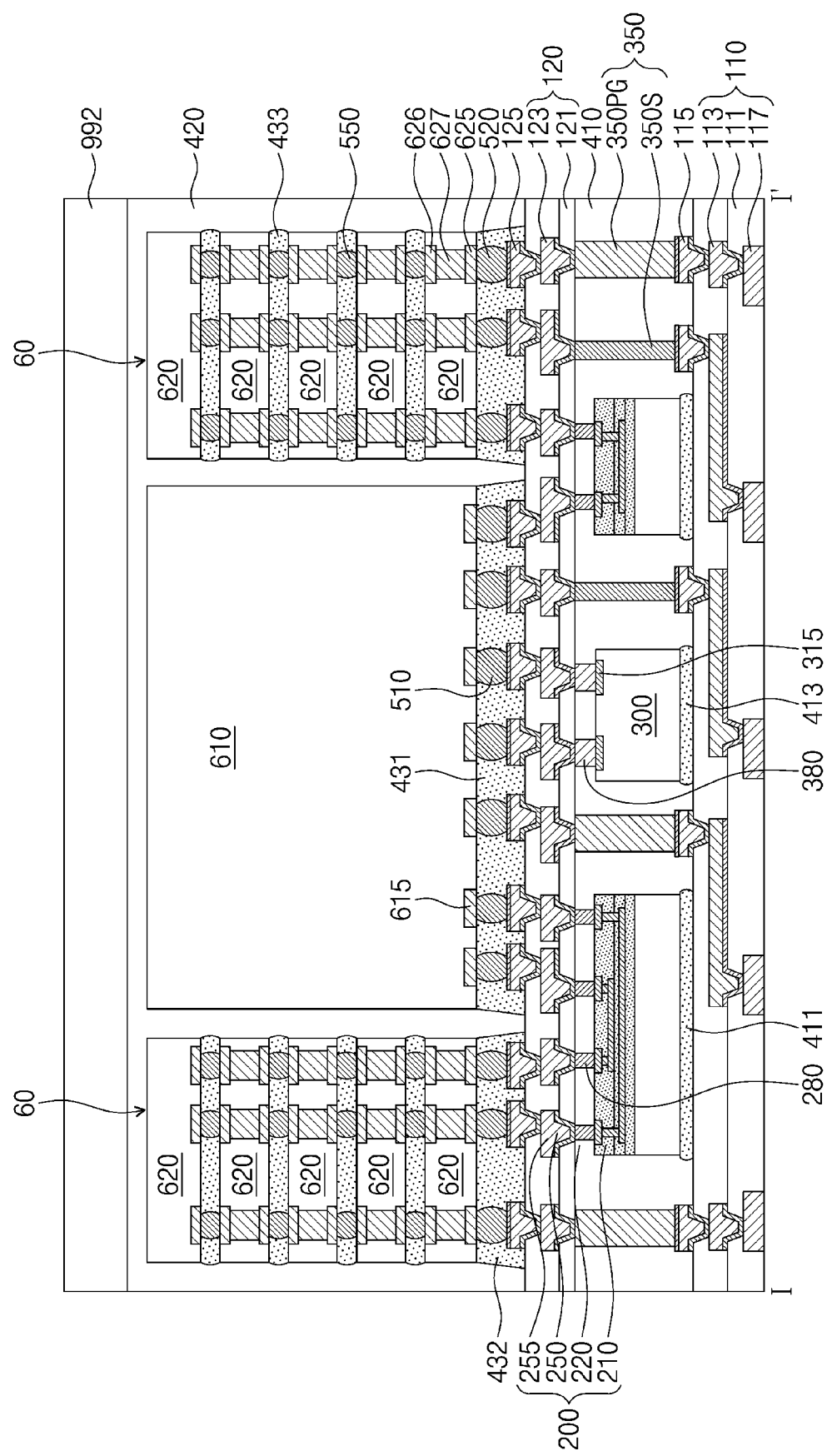

Referring to FIG. 5H, the first carrier substrate 990 and the carrier adhesive layer 980 may be removed to expose the bottom surface of the first redistribution layer 110. For example, the bottom surface of the lowermost one of the first insulating layers 111 and the bottom surfaces of the under-bump patterns 117 may be exposed to the outside.

Referring back to FIG. 1B, the solder terminals 500 may be respectively formed on the bottom surfaces of the under-bump patterns 117 and thus may be coupled to the under-bump patterns 117, respectively. The formation of the solder terminals 500 may include performing a solder ball attaching process. Thereafter, the second carrier substrate 992 may be removed. The semiconductor package 11 may be fabricated through the afore-described process.

Figure 6:
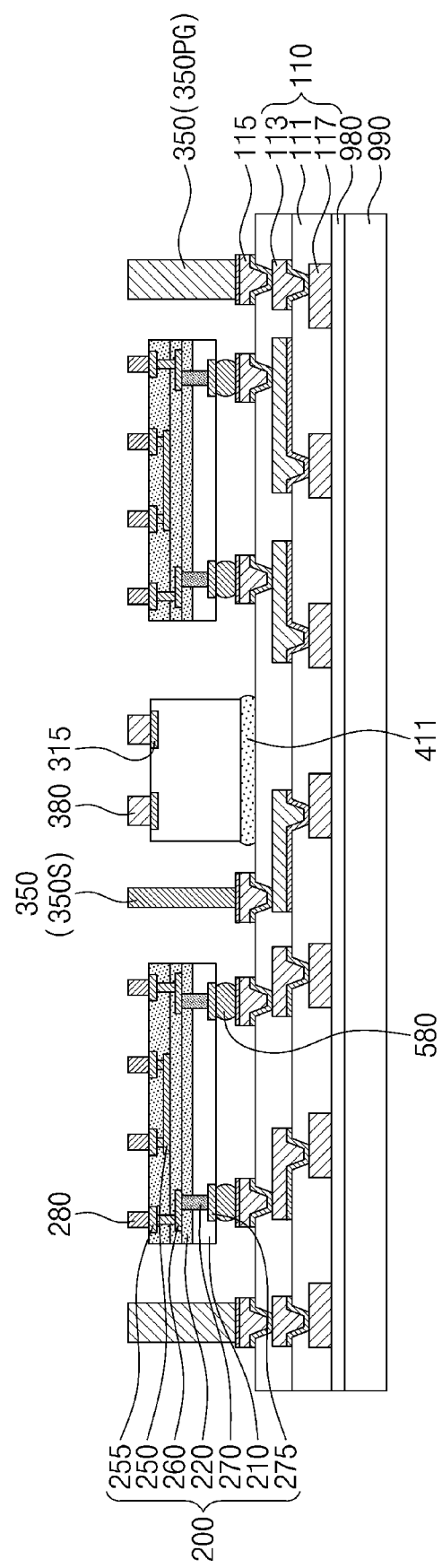
FIG. 6 is a diagram illustrating a process of connecting a bridge structure to a first redistribution layer, according to an embodiment of the inventive concept.

FIG. 6 is a diagram illustrating a process of connecting a bridge structure to a first redistribution layer, according to an embodiment of the inventive concept.

Referring to FIG. 6, the first redistribution layer 110, the first redistribution pads 115, and the conductive structures 350 may be formed on the first carrier substrate 990. The carrier adhesive layer 980 may be further formed between the first carrier substrate 990 and the first redistribution layer 110. The first redistribution layer 110 and the first redistribution pads 115 may be formed in the same manner as the previous embodiment described with reference to FIG. 5A. The conductive structures 350 may be formed in the same manner as the previous embodiment described with reference to FIG. 5B.

The bridge structures 200 may be prepared. Each of the bridge structures 200 may include the base substrate 210, the insulating patterns 220, the connection structure 250, the connection pads 255, the metal patterns 260, the penetration structures 270, and the lower connection pads 275.

The bridge structures 200 may be connected to the first redistribution layer 110. The connecting of the bridge structures 200 to the first redistribution layer 110 may include forming the first solder patterns 580 between the first redistribution pads 115 and the lower connection pads 275. A reflow process on the first solder patterns 580 may be performed to connect the first solder patterns 580 to the first redistribution pads 115 and the lower connection pads 275, respectively. Accordingly, the penetration structures 270 may be electrically connected to the first redistribution layer 110.

The disposing of the passive device 300 may be performed before or after disposing the bridge structures 200. The disposing of the passive device 300 may be performed using the second adhesive film 413.

The first pillar patterns 280 may be formed on the connection pads 255 of the bridge structures 200. The second pillar patterns 380 may be formed on the terminals 315 of the passive device 300.

Referring to FIGS. 6 and 2B, the lower mold layer 410 and the second redistribution layer 120 may be formed on the first redistribution layer 110, and the first semiconductor chip 610 and the chip stacks 60 may be mounted on the second redistribution layer 120. The under-fill layer 430 and the upper mold layer 420 may be formed on the second redistribution layer 120, and the heat-dissipation structure 999 may be formed on the upper mold layer 420. Thereafter, the first carrier substrate 990 and the carrier adhesive layer 980 may be removed, and the solder terminals 500 may be formed on the bottom surfaces of the under-bump patterns 117, respectively. The semiconductor package 12 may be fabricated through the afore-described process.

Figure 7:
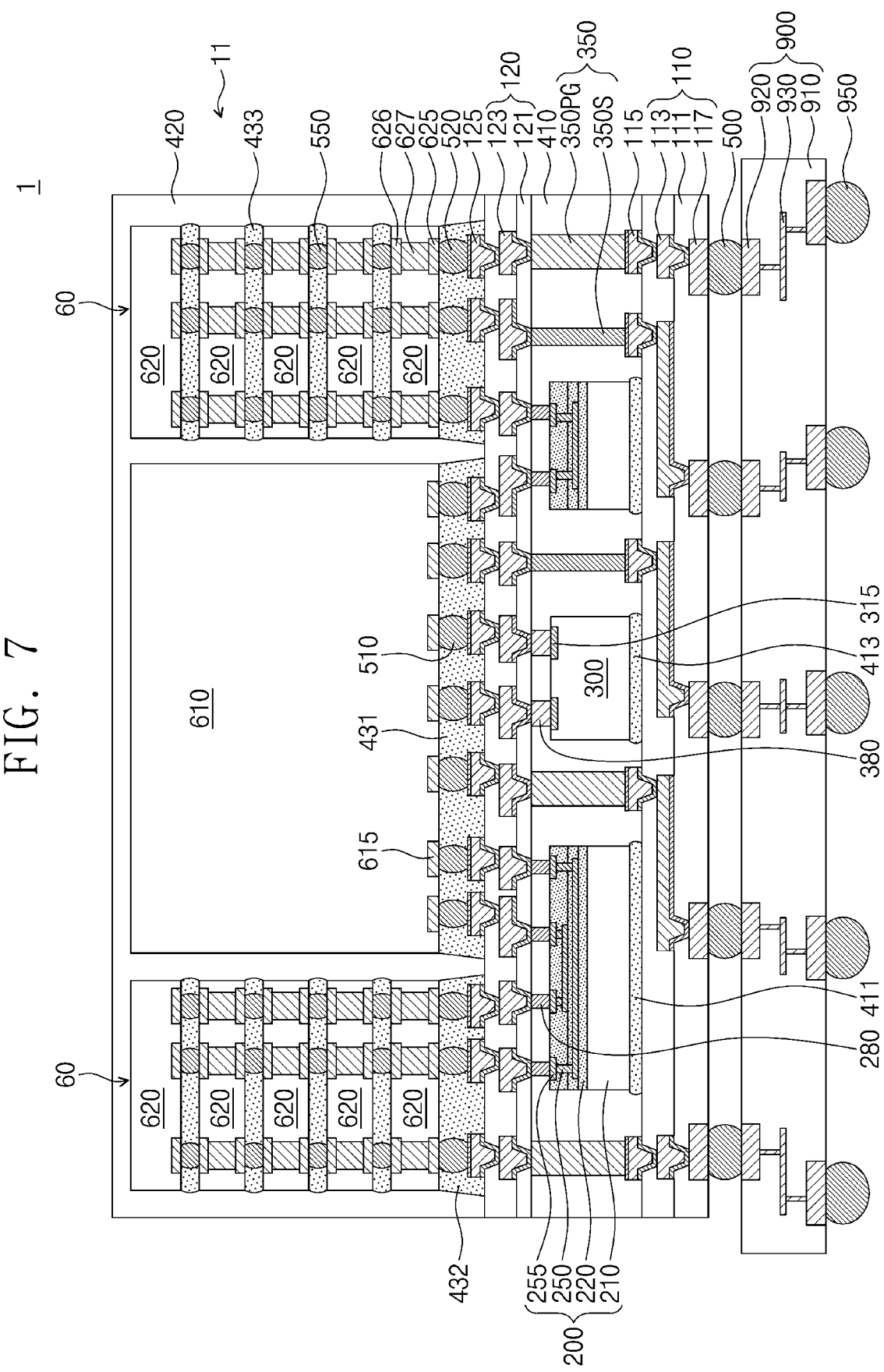
FIG. 7 is a sectional view illustrating a stack-type semiconductor package according to an embodiment of the inventive concept.

FIG. 7 is a sectional view illustrating a stack-type semiconductor package according to an embodiment of the inventive concept.

Referring to FIG. 7, a stack-type semiconductor package 1 may include outer terminals 950, a package substrate 900, and the semiconductor package 11. The package substrate 900 may be a printed circuit board (PCB) with a circuit pattern. The package substrate 900 may include an insulating base layer 910, substrate pads 920, and internal lines 930. The insulating base layer 910 may include a plurality of stacked layers. As another example, the insulating base layer 910 may be a single layer. The substrate pads 920 may be provided on a top surface of the insulating base layer 910. The internal lines 930 may be provided in the insulating base layer 910 and may be coupled to the substrate pads 920, respectively. The expression "an element is coupled or connected to the package substrate 900" may mean that the element is coupled or connected to at least one of the internal lines 930. The substrate pads 920 and the internal lines 930 may be formed of or include at least one of metallic materials (e.g., copper, aluminum, tungsten, and/or titanium).

The outer terminals 950 may be disposed on a bottom surface of the package substrate 900. External electrical signals may be transmitted to and from the package substrate 900 through the outer terminals 950. The outer terminals 950 may include solder balls, solder pillars, solder bumps, or combinations thereof. The outer terminals 950 may be formed of or include at least one of metallic materials, such as soldering materials.

The semiconductor package 11 may include the solder terminals 500, the interposer structure, the first semiconductor chip 610, the chip stack 60, and the upper mold layer 420. The interposer structure may include the first redistribution layer 110, the first redistribution pads 115, the second redistribution layer 120, the second redistribution pads 125, the bridge structure 200, the passive device 300, and the conductive structures 350.

The semiconductor package 11 described with reference to FIGS. 1A to 1E may be mounted on the package substrate 900. The mounting of the semiconductor package 11 on the package substrate 900 may include coupling the solder terminals 500 to the substrate pads 920, respectively. Although not illustrated in the drawings, the semiconductor package 12 of FIGS. 2A to 2D, the semiconductor package 13 of FIGS. 3A and 3B, the semiconductor package 14 of FIG. 4A, or the semiconductor package 15 of FIG. 4B may be mounted on the package substrate 900.

According to an embodiment of the inventive concept, a passive device and a bridge structure may be interposed between first and second redistribution layers, and this may make it possible to realize a highly integrated and small size semiconductor package. A first semiconductor chip and chip stacks may be electrically connected to each other through the bridge structure, and thus, a thickness of the second redistribution layer may be reduced. Accordingly, it may be possible to reduce a size of a semiconductor package. The passive device may be electrically connected to a first semiconductor chip through a second redistribution layer, and in this case, a length of an electrical conduction path between the passive device and the first semiconductor chip may be reduced. Accordingly, it may be possible to improve electric characteristics of the semiconductor package.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
   a first redistribution layer;
   a passive device disposed on a top surface of the first redistribution layer;
   a bridge structure disposed on the top surface of the first redistribution layer and laterally spaced apart from the passive device;
   a second redistribution layer disposed on and electrically connected to the passive device and the bridge structure;
   conductive structures disposed between the first redistribution layer and the second redistribution layer and laterally spaced apart from the passive device and the bridge structure;
   a first semiconductor chip mounted on a top surface of the second redistribution layer;
   a second semiconductor chip mounted on the top surface of the second redistribution layer;
   a lower mold layer provided in a gap region between the first redistribution layer and the second redistribution layer to cover side surfaces of the conductive structures,
   wherein the conductive structures comprise:
   a signal structure having a first width;
   a ground/power structure laterally spaced apart from the signal structure, the ground/power structure having a second width larger than the first width, and
   wherein the first semiconductor chip and the second semiconductor chip vertically overlap at least one of the signal structure and the ground/power structure.

2. The semiconductor package of claim 1, wherein the conductive structures further comprises a serializer/deserializer (SerDes) structure, and
   a width of the SerDes structure is larger than the first width.

3. The semiconductor package of claim 1, further comprising solder patterns interposed between the first redistribution layer and the bridge structure,
   wherein the bridge structure comprises a penetration structure penetrating the same, and
   the penetration structure is coupled to the first redistribution layer through the solder patterns.

4. The semiconductor package of claim 3, further comprising an adhesive film interposed between the first redistribution layer and the passive device,
   wherein a thickness of the adhesive film in a direction perpendicular to the top surface of the first redistribution layer is smaller than a distance between the first redistribution layer and the bridge structure.

5. The semiconductor package of claim 1, further comprising:
first pillar patterns interposed between the bridge structure and the second redistribution layer; and
second pillar patterns interposed between and coupled to the passive device and the second redistribution layer,
wherein a pitch of the first pillar patterns is smaller than a pitch of the second pillar patterns.

6. The semiconductor package of claim 1, wherein the first semiconductor chip comprises a logic chip,
the second semiconductor chip comprises a memory chip,
a plurality of passive devices, which are laterally spaced apart from each other, and
the number of the passive devices overlapped with the first semiconductor chip is greater than the number of the passive devices overlapped with the second semiconductor chip, when viewed in a plan view.

7. The semiconductor package of claim 6, wherein the second semiconductor chip comprises a plurality of stacked second semiconductor chips.

8. The semiconductor package of claim 1, wherein the bridge structure comprises:
a base substrate;
an insulating pattern on the base substrate;
connection pads on the insulating pattern; and
a connection structure provided in the insulating pattern and coupled to at least two of the connection pads,
wherein the first semiconductor chip is electrically connected to the second semiconductor chip through the connection structure, and
a thickness of the second redistribution layer in a direction perpendicular to the top surface of the first redistribution layer has a value selected from a range between 3 μm and 20 μm.

9. The semiconductor package of claim 1, further comprising chip stacks mounted on the top surface of the second redistribution layer,
wherein each of the chip stacks comprises a plurality of stacked memory chips,
the first semiconductor chip is disposed between the chip stacks,
the second semiconductor chip is disposed between the chip stacks, and
the second semiconductor chip is of the same kind as the first semiconductor chip.

10. The semiconductor package of claim 1, wherein the second width is 120% to 300% of the first width.

11. A semiconductor package, comprising:
a first redistribution layer;
first passive devices disposed on a top surface of the first redistribution layer;
a bridge structure disposed on the top surface of the first redistribution layer and laterally spaced apart from the first passive devices;
a second redistribution layer disposed on the first passive devices and the bridge structure and electrically connected to the first passive devices and the bridge structure;
conductive structures disposed between the first redistribution layer and the second redistribution layer and laterally spaced apart from the first passive devices and the bridge structure;
a lower mold layer provided in a gap region between the first redistribution layer and the second redistribution layer to cover side surfaces of the conductive structures;
a first semiconductor chip mounted on a top surface of the second redistribution layer; and
chip stacks mounted on the top surface of the second redistribution layer and laterally spaced apart from the first semiconductor chip, each of the chip stacks comprising a plurality of stacked second semiconductor chips, wherein
the second semiconductor chips are of a different kind from the first semiconductor chip,
the bridge structure is electrically connected to the first semiconductor chip and one of the chip stacks,
each of the first passive devices is overlapped with the first semiconductor chip, when viewed in a plan view, and
the first passive devices are spaced apart from the chip stack, when viewed in a plan view, and
wherein the conductive structures comprise:
a signal structure having a first width;
a ground/power structure laterally spaced apart from the signal structure, the ground/power structure having a second width larger than the first width, and
wherein the first semiconductor chip and the second semiconductor chip vertically overlap at least one of the signal structure and the ground/power structure.

12. The semiconductor package of claim 11, further comprising an electronic device, which is disposed on the top surface of the first redistribution layer and is laterally spaced apart from the first passive devices and the bridge structure,
wherein the electronic device comprises an input/output chip, a power management chip, or a chiplet.

13. The semiconductor package of claim 11, further comprising a second passive device, which is disposed on the top surface of the first redistribution layer and is laterally spaced apart from the first passive devices and the bridge structure,
wherein the second passive device is overlapped with at least one of the chip stacks and is spaced apart from the first semiconductor chip, when viewed in a plan view, and
the number of the first passive devices is greater than the number of the second passive device.

14. The semiconductor package of claim 11, further comprising:
a solder pattern interposed between the first redistribution layer and the bridge structure and electrically connected to the first redistribution layer; and
a pillar pattern interposed between the bridge structure and the second redistribution layer and electrically connected to the second redistribution layer,
wherein the bridge structure comprises a penetration structure penetrating the same, and
the pillar pattern is coupled to the solder pattern through the penetration structure.

15. The semiconductor package of claim 14, further comprising adhesive films provided between the first redistribution layer and the first passive devices, respectively,
wherein a thickness of the adhesive films in a direction perpendicular to the top surface of the first redistribution layer has a value selected from a range between 3 μm and 25 μm.

16. A semiconductor package, comprising:
a first redistribution layer including a first seed pattern and a first conductive pattern on the first seed pattern;
solder terminals disposed on a bottom surface of the first redistribution layer;

passive devices disposed on a top surface of the first redistribution layer;

adhesive films interposed between the first redistribution layer and the passive devices, respectively;

a bridge structure disposed on the top surface of the first redistribution layer and laterally spaced apart from the passive devices;

a second redistribution layer disposed on the passive devices and the bridge structure, the second redistribution layer comprising a second seed pattern and a second conductive pattern on the second seed pattern;

first pillar patterns interposed between and electrically connected to the bridge structure and the second redistribution layer;

second pillar patterns interposed between the passive devices and the second redistribution layer;

conductive structures disposed between the first redistribution layer and the second redistribution layer and laterally spaced apart from the passive device and the bridge structure;

a lower mold layer provided in a gap region between the first redistribution layer and the second redistribution layer to cover side surfaces of the passive devices, side surfaces of the bridge structure, and side surfaces of the conductive structures;

a first semiconductor chip mounted on a top surface of the second redistribution layer;

first bonding bumps between the second redistribution layer and the first semiconductor chip;

chip stacks mounted on the top surface of the second redistribution layer and laterally spaced apart from the first semiconductor chip, each of the chip stacks comprising a plurality of stacked second semiconductor chips; and second bonding bumps between the second redistribution layer and the chip stacks, wherein the first semiconductor chip is disposed between the chip stacks, when viewed in a plan view, the second semiconductor chips are of a different kind from the first semiconductor chip, the bridge structure is overlapped with the first semiconductor chip and one of the chip stacks, when viewed in a plan view, each of the passive devices is overlapped with the first semiconductor chip, when viewed in a plan view, and is electrically connected to the first semiconductor chip, and the passive devices are spaced apart from the chip stack, when viewed in a plan view, and wherein the conductive structures comprise:

a signal structure having a first width; and a ground/power structure laterally spaced apart from the signal structure, the ground/power structure having a second width larger than the first width, and wherein the first semiconductor chip and the second semiconductor chip vertically overlap at least one of the signal structure and the ground/power structure.

17. The semiconductor package of claim 16, wherein a pitch of the first pillar patterns is smaller than a pitch of the second pillar patterns.

18. The semiconductor package of claim 16, wherein a thickness of the first redistribution layer in a first direction perpendicular to the top surface of the first redistribution layer has a value selected from a range between 10 μm and 30 μm, and a thickness of the second redistribution layer in the first direction has a value selected from a range between 3 μm and 20 μm.

* * * * *